(12) United States Patent
Katagiri et al.

(10) Patent No.: US 7,582,885 B2
(45) Date of Patent: Sep. 1, 2009

(54) CHARGED PARTICLE BEAM APPARATUS

(75) Inventors: Souichi Katagiri, Kodaira (JP); Takashi Ohshima, Higashimurayama (JP); Toshihide Agemura, Hitachinaka (JP); Mitsugu Sato, Hitachinaka (JP); Takashi Furukawa, Sagamihara (JP)

(73) Assignee: Hitachi High-Technologies Corp., Tokyo (JP)

( * ) Notice: Subject to any disclaimer, the term of this patent is extended or adjusted under 35 U.S.C. 154(b) by 178 days.

(21) Appl. No.: 11/401,878

(22) Filed: Apr. 12, 2006

(65) Prior Publication Data
US 2006/0231773 A1 Oct. 19, 2006

(30) Foreign Application Priority Data
Apr. 13, 2005 (JP) ............... 2005-115233

(51) Int. Cl.
*H01J 1/50* (2006.01)
(52) U.S. Cl. ............... 250/492.3; 250/396 ML; 313/153
(58) Field of Classification Search ............ 250/492.3, 250/310, 311, 441.11, 396 ML; 417/48, 417/49; 313/153–162
See application file for complete search history.

(56) References Cited

U.S. PATENT DOCUMENTS

| | | | | |
|---|---|---|---|---|
| 2,369,796 A * | 2/1945 | Ramberg | ................ | 313/443 |
| 3,178,604 A * | 4/1965 | Eklund | ................ | 313/147 |
| 4,833,362 A * | 5/1989 | Crewe | ................ | 313/7 |
| 5,399,860 A * | 3/1995 | Miyoshi et al. | ................ | 250/310 |
| 5,548,183 A * | 8/1996 | Miyoshi et al. | ................ | 313/153 |
| 5,805,044 A * | 9/1998 | Leupold | ................ | 335/306 |
| 6,320,194 B1 * | 11/2001 | Khursheed et al. | ................ | 250/442.11 |
| 6,710,354 B1 * | 3/2004 | Koch et al. | ................ | 250/441.11 |
| 6,797,968 B2 * | 9/2004 | Tsukihara et al. | ................ | 250/492.21 |
| 6,949,752 B2 * | 9/2005 | Okura et al. | ................ | 250/441.11 |
| 2003/0127593 A1 * | 7/2003 | Shinada et al. | ................ | 250/310 |
| 2004/0113073 A1 * | 6/2004 | Nakasuji et al. | ................ | 250/306 |
| 2004/0211914 A1 * | 10/2004 | Buijsse | ................ | 250/398 |
| 2005/0052103 A1 * | 3/2005 | Katagiri et al. | ................ | 313/7 |
| 2006/0033035 A1 * | 2/2006 | Itzkovitch et al. | ................ | 250/396 ML |

(Continued)

FOREIGN PATENT DOCUMENTS

JP 06-111745 4/1994

(Continued)

OTHER PUBLICATIONS

Shimoyama, et al ("Magnetic field superimposed electron gun with a point cathode" Journal of Electron Microscopy—Japan 32(2) 1983, pp. 11-104).*

(Continued)

*Primary Examiner*—David A Vanore
*Assistant Examiner*—Michael Maskell
(74) *Attorney, Agent, or Firm*—Mattingly & Malur, P.C.

(57) ABSTRACT

A small-sized charged particle beam apparatus capable of maintaining high vacuum even during emission of an electron beam is provided. A nonevaporative getter pump is placed upstream of differential pumping of an electron optical system of the charged particle beam apparatus, and a minimum number of ion pumps are placed downstream, so that both the pumps are used in combination. Further, by mounting a detachable coil on an electron gun part, the inside of a column can be maintained under high vacuum with a degree of vacuum in the order of $10^{-8}$ Pa.

5 Claims, 19 Drawing Sheets

U.S. PATENT DOCUMENTS

2007/0138404 A1* 6/2007 Frosien et al. .............. 250/398

FOREIGN PATENT DOCUMENTS

| JP | 09-326425 | | 12/1997 |
| JP | 2000-149850 | | 5/2000 |
| JP | 2000249055 A | * | 9/2000 |
| JP | 2002-358920 | | 12/2002 |
| JP | 2005-108806 | | 4/2005 |
| WO | WO2005027175 | * | 3/2005 |

OTHER PUBLICATIONS

Terris, et al ("Magnetic microlens with an automatically sharp field emitter" J. Vac. Sci. Technol. B 11(6) Nov./Dec. 1993).*

Komiya, et al ("Enhancement of Noble Gas Pumping for a Sputter-Ion Pump" J. Vac. Sci. Technol. 6(1) pp. 54-57 (1969)).*

* cited by examiner

CHARGED PARTICLE BEAM APPARATUS

CLAIM OF PRIORITY

The present application claims priority from Japanese application JP 2005-115233 filed on Apr. 13, 2005, the content of which is hereby incorporated by reference into this application.

BACKGROUND OF THE INVENTION

The present invention relates to a charged particle beam apparatus, and particularly to an electron microscope or a focused ion beam apparatus.

DESCRIPTION OF THE RELATED ART

A conventional scanning electron microscope (SEM) accelerates an electron beam which is emitted from an electron gun consisting of an electron source of a field emitter type or a thermal field emitter type, forms the electron beam into a narrow electron beam by an electron lens, scans a sample with the narrow electron beam as a primary electron beam by using a scanning deflector, and detects resulting secondary electrons or backscattered electrons to obtain an image. As a material of the electron source, tungsten is used in the case of a multi purpose SEM. For an electron source for observation of a semiconductor, the material may include tungsten and zirconia.

For emitting a satisfactory electron beam from the aforementioned electron source for a long time period, it is necessary to maintain the surroundings of the electron source under high vacuum ($10^{-7}$ to $10^{-8}$ Pa). For this purpose, a method of forced differential pumping of a column by a plurality of ion pumps (IP-1, IP-2 and IP-3) as shown in FIG. 2 has been employed. This method is disclosed in JP-A-2002-358920. Although the ion pump has an advantage that there is no movable part and a pressure of $10^{-8}$ Pa or less can be maintained only by turning on electricity, the ion pump has a size of larger than several tens cm square and additionally requires a magnetic shield on the column side for the reason of generating a magnetic field, thus requiring a considerable volume and weight.

As a method for getting rid of such a situation and achieving miniaturization, there is an electron gun eliminating the need for the ion pump by inclusion of a nonevaporative getter pump as disclosed in U.S. Pat. No. 4,833,362 and JP-A-6-111745 or by inclusion of a getter ion pump as disclosed in JP-A-2000-149850.

When the field emitter type electron gun is used as described above, a high degree of vacuum of $10^{-7}$ to $10^{-8}$ Pa is required, and therefore a differential pumping structure in which high vacuum can be obtained by using a plurality of dedicated ion pumps is employed for evacuation of a column. The conventional technique has a problem of difficulty of miniaturization because ion pumps are bulky as shown in FIG. 2, and required to be placed at a certain distance from a column in consideration of leakage of a magnetic field. As another problem stemming from the aforementioned problem, there is a significant spatial restriction because the ion pumps are connected to an electron gun column, and thus for example, it is difficult to mount coils for superimposed magnetic fields to increase a current value.

Further, since the heavy ion pumps are placed at a high position with respect to a column for an electron optical system, i.e., an electron optical system column, the center of mass is elevated so that vibrations tend to occur to affect images.

A method in which a body of the ion pump is made to have a doughnut-shaped structure so that it is coaxial with the column, or the like, may be employed, but the ion pump body has a diameter of at least about several tens cm, and therefore there is a limitation on miniaturization.

Further, in a method using a nonevaporative getter pump, it is difficult to pump out rare gases such as helium and argon and electrochemically stable gases such as methane, and it is necessary to arrange a special condition of excluding a gas hard to be pumped out in a sealed structure, and therefore the method has not yet come into practical use for an apparatus such as a SEM which is opened to air each time a sample is changed.

At this point, the nonevaporative getter pump refers to a vacuum pump constructed by using an alloy that absorbs a gas only by heating without evaporating a getter. For absorbing a gas, it is necessary for the gas to have slight electric potential or to easily chemically bond to molecules of a getter alloy, but electrochemically stable gases such as rare gases and fluoro carbon are fairy balanced, so as to be hard to be pumped out, which is a problem.

For activating the nonevaporative getter pump, it is necessary to heat it to at least 350° C. or more, but the limit of temperature to which a coil and a wiring forming an electron optical system are resist is about 100° C., and therefore the nonevaporative getter pump cannot sufficiently be activated so that the nonevaporative getter pump cannot have a sufficient pumping speed, and resultantly, desired high vacuum cannot be attained.

Further, when the electron source is operated, some of emitted electrons impinge upon components of the electron optical system to discharge various kinds of gases, and the degree of vacuum is therefore degraded, resulting in shortened life time of the electron gun. Particularly, as the electron gun and the electron optical system are miniaturized to decrease the volume, a total pressure increases even though a partial pressure of gases hard to be pumped out, such as the aforementioned rare gases, is low, and the tendency of degradation in the degree of vacuum becomes noticeable, which raises a problem.

BRIEF SUMMARY OF THE INVENTION

In view of the problems described above, it is an object of the present invention to provide a small-sized charged particle beam apparatus capable of maintaining high vacuum even during emission of an electron beam. This charged particle beam apparatus also includes a FIB (focused ion beam) apparatus using ion particles in addition to the electron beam.

The present invention is achieved by making an electron optical system of the charged particle beam apparatus have a differential pumping structure, placing a nonevaporative getter pump in a vacuum chamber on the upstream side, placing a minimum number of ion pumps in a vacuum chamber on the downstream side, and using both the pumps together. To the ion pump is more preferably applied a sputter ion pump pumping out a rare gas with high efficiency, or a noble ion pump. As a noticeable effect, a time period over which high vacuum is maintained can considerably be prolonged.

A turbo molecular pump can be used instead of the ion pump. Further, another problem is solved by mounting a detachable coil or permanent magnet on an electron gun part.

By using the present invention, small-sized charged particle beam apparatuses capable of maintaining the inside of a column under high vacuum of an order of $10^{-8}$ Pa, for example a small-sized scanning electron microscope, a focused ion beam apparatus and a charged particle beam apparatus having a plurality of columns can be obtained. By applying the present invention to a magnetic-field-superposed electron gun, miniaturization can be facilitated, and a time period over which high vacuum is maintained can considerably be prolonged.

Further, a small-sized SEM column for monitoring a position of a probe of a prober apparatus directly measuring an electric property of a semiconductor can be easily included.

As another effect, an electron beam irradiation column of a mirror projection type electron beam inspection apparatus for inspection of semiconductor elements can be miniaturized.

Other objects, features and advantages of the invention will become apparent from the following description of the embodiments of the invention taken in conjunction with the accompanying drawings.

DETAILED DESCRIPTION OF THE INVENTION

Embodiment 1

Figure 1:
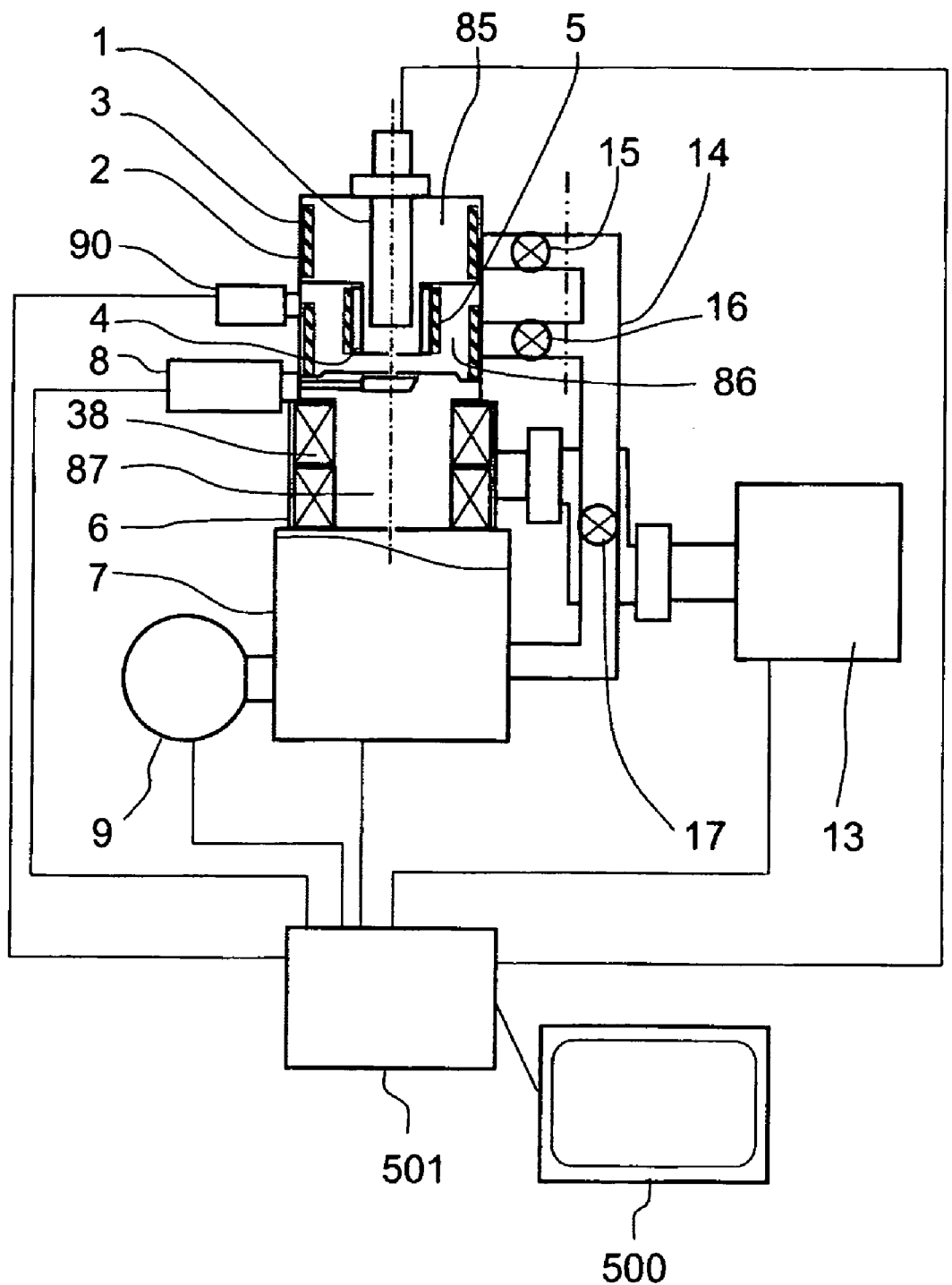
FIG. 1 is a view for explaining a basic configuration according to the present invention.

FIG. 1 shows an embodiment according to the present invention. As an electron source, a thermal field emitter (TFE) is used. This electron source 1 is mounted on the flange of 152 mm in diameter and is combined with a feedthrough to electrodes (suppressor, extractor electrode and chip) not shown in the drawing. This electron source 1 is inserted into an electron gun column 2 and is fixed. The electron gun column 2 comprises a first vacuum chamber 85 and a second vacuum chamber 86 which is placed apart from the first vacuum chamber 85 by an aperture. Thereby, a nonevaporative getter pump gives rise to differential pumping effects so as to enable ultimate vacuum of the first vacuum chamber 85 to reach high (decrease pressure). Depending on designing, the first vacuum chamber 85 and the second vacuum chamber 86 may be substituted with one vacuum chamber so as to omit a part of piping including a valve 16 of a rough pumping port 14, thereby attaining further compactness. The rough pumping port 14 of a charged particle beam apparatus of the present embodiment can be separated at the portion of chain doubledashed line in FIG. 1, that is, outside the valves 15 and 16. On this account, the portion of chain double-dashed line in FIG. 1 is provided with vacuum sealing member such as a flange and so on.

The electron gun column 2 comprises a sheet-shaped nonevaporative getter pump 3 along its bore. This nonevaporative getter pump 3 is activated by heating to absorb gas. A heater (not shown in the drawing) for that purpose is provided outside the electron gun column 2. In the present embodiment, a sheath heater is wound around the column. Also, a nonevaporative getter pump 5 is wound around the circumference of an electrode heater 4. Moreover, by selecting a sheet type nonevaporative getter pump 3, the sheet type pump can have a surface area larger than that of a block type one in the narrow vacuum chamber 2, so as to give rise to an effect that an increase in pumping speed and extension of a life can be obtained.

Here, the sheet-shaped nonevaporative getter pump is used, but nonevaporative getter material may be deposited on the surface of the above described heater for use. Thereby, mounting density can be intensified and dropping out risk of the nonevaporative getter material can be reduced. Thus, since nonevaporative getter material is an alloy and is electrically conductive, in case of dropout, short circuit occurs to increase risk of discharging electricity. Therefore, it can be said to be particularly effective for applying to one such as electron gun where high voltage parts are commingled.

The electron gun column has a thermocouple on its side to monitor heating temperature of the nonevaporative getter pump 3. In the present embodiment, the sheet-shaped nonevaporative getter pump 3 disposed along the bore of the electron gun column 2 is activated at 400° C. in 10 minutes. And, the nonevaporative getter pump 5 disposed in the circumference of the electrode heater 4 is activated at 550 to 600° C. The reason thereof is that at the time of baking for about 8 hours with the electrode heater as will be described below, it prevents the nonevaporative getter pump 5 around the heater from being activated and absorbing a lot of gas, so as not to deteriorate the life.

When the electron source 1 emits electrons, a part of emitted electrons hit components to discharge gas containing hydrocarbon. Under conditions with small volume of the electron gun column 2 and no forced pumping by an ion pump, as this embodiment, this hydrocarbon gas is hard to be pumped out with the nonevaporative getter pump, and thus, there is a problem that vacuum level might get easily deteriorated to influence the electron source badly. Moreover, at the downstream side of the electron gun column 2, there is a electron optical system column 6 including a coil 38 and electric wiring, and therefore it normally cannot be heated at 100° C. or higher. Therefore, a substantial amount of gas that is hard for the nonevaporative getter pump to pump out is expected to come out from the wall surface at the vacuum side due to insufficient baking. Moreover, in addition, rare gas such as argon gas from a sample chamber 7 having lowest vacuum level flows in the electron gun column 2, which will result in reducing vacuum level inside the electron gun column 2. Since the argon gas is contained by about 1% in the atmosphere, it is necessary to pay a special attention thereto. The sample chamber is pumped with a turbo-molecule pump 9 to derive vacuum, which is normally about $10^{-3}$ Pa.

Figure 3:
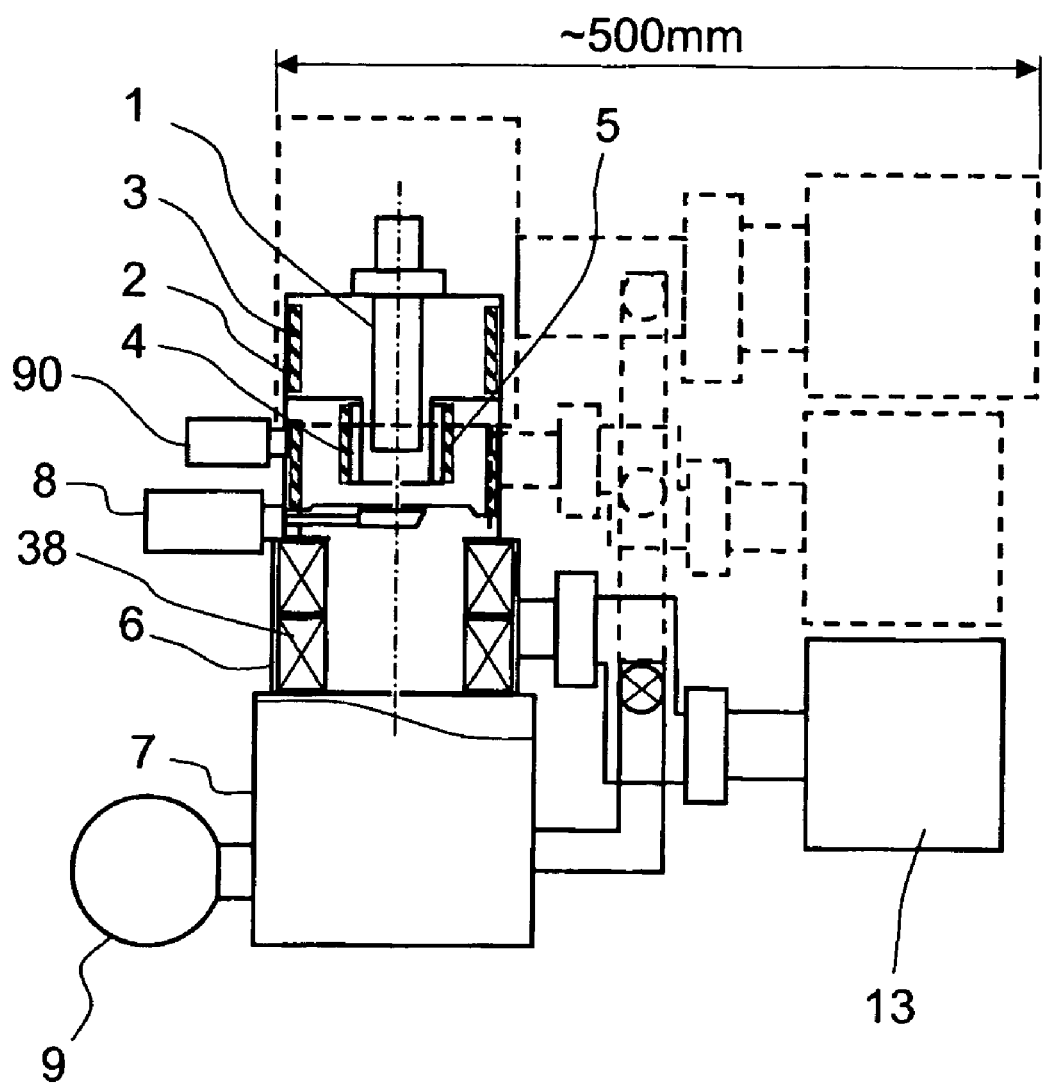
FIG. 3 is a view for explaining a difference in apparatus size between the present invention and an example of the conventional apparatus.

In order to solve the problem, a conventional apparatus used to be configured to pump each chamber partitioned by a wall with apertures with small diameter with a respective dedicated ion pump (IP-1, 2, 3). As shown in FIG. 3, difference from the present embodiment in size can be confirmed to be remarkable. Each ion pump (IP-1, 2, 3) is fixed in a position apart from the column to a certain extent in order to avoid influence of magnetic field generated from the pump, which also results in enlarging the apparatus's size.

Next, with reference to FIG. 1, the present embodiment will be described in detail. As described above, since pumping only with a nonevaporative getter pump 3 cannot maintain high vacuum level, an ion pump is used together with the nonevaporative getter pump in the present invention. The present apparatus comprises an most upstream electron gun chamber (first vacuum chamber 85) having an electron source 1; an intermediate chamber (second vacuum chamber 86) communicated therefrom through an aperture; and, an electron optical system column 6 (third vacuum chamber 87) communicated therefrom through another aperture. Moreover, the third vacuum chamber 87 is communicated to a sample chamber 7 partitioned apart therefrom by a wall with another aperture, so as to adopt a differential pumping system.

The electron gun chamber on the upstream side and the intermediate chamber comprise nonevaporative getter pumps 3 and 5 and the electron optical system column 6 on the downstream side is provided with an ion pump 13 to implement vacuum pumping. Since partial pressure of the gas that is hard for the nonevaporative getter pump to pump is extremely small, it was found from an experiment that even only one small ion pump with pumping speed of 20 liter/second can sufficiently pump the gas. Especially, by applying a sputter ion pump or novel ion pump with high pumping efficiency for rare gas, the apparatus can be used even at a further smaller pumping speed, and thus, will be more advantageous. As shown in FIG. 3, sizable reduction will become feasible as compared with three units applied to the conventional apparatus (indicated by a broken line), which is effective for making the apparatus compact. Moreover, weight of the upper part of the apparatus can be reduced and furthermore, by providing the heavy ion pump at the lower side as much as possible, the center of mass goes down to give rise to an effect of greatly improving the vibration property.

A process of starting pumping in case of taking a configuration of the present embodiment will be described. All the parts exposed to vacuum in the electron gun column 2 undergo cleaning and drying and thereafter are assembled. Thereafter, while vacuuming, the assembled electron gun column 2 is mounted on another apparatus which is different from the apparatus of the present embodiment and capable of baking without temperature limit such as not more than 100° C., and is baked at 300° C. for about 8 hours with a sheath heater (not shown in the drawing) wound around the electron gun column 2, so as to carry out degasification of the interior of the column sufficiently. Thereafter, being opened to the atmosphere, the electron gun column 2 is removed and incorporated to the electron optical system column 6 of the scanning electron microscope main body so that vacuuming starts with the turbo-molecule pump 9. At that time, valves 15, 16 and 17 attached to a rough pumping port 14 are opened so that the gas inside the electron gun column 2 can be pumped efficiently.

In this state, by providing power to the heater wound around the outside of the electron gun column 2, not shown in the drawing, baking is carried out. The temperature of the contact surface between the electron gun column 2 and the electron optical system column 6 is monitored. When the temperature reaches about 80° C., the temperature is controlled with an ON-OFF control action which turns on and cuts electricity to the heater, and the column is baked for about 10 hours. Thereafter, voltage is applied to the electrode heater 4 to implement baking and to activate the nonevaporative getter pump 5 around the electrode heater 4 at the same time. At this time, the target temperature of the heater part 4 is about 550° C. and is maintained for about an hour. Thereafter, the column is naturally cooled to reach the room temperature, and then, the valves 15, 16 and 17 attached to the rough pumping port 14 are closed. Then, by applying power to the ion pump 13, the apparatus is pumped.

According to the above described procedure, the ultimate vacuum inside the electron gun column 2 reached a level of $10^{-8}$ Pa. In that state, it has been confirmed that the degree of vacuum inside the electron gun column 2 can maintain the level of $10^{-8}$ Pa even by driving a gun-valve 8 with an air cylinder and opening the valve so as to open the column to the sample chamber separated from the column by a wall with the aperture. Incidentally, the degree of vacuum attained by the ion pump 13 was about $5 \times 10^{-6}$ Pa. It can be said that the differential pumping worked effectively and higher degree of vacuum is derived on the more upstream site.

Next, control means 501 of the apparatus of the present embodiment will be described. A turbo-molecule pump 9, an ion pump 13, an electron source 1, a gun-valve 8, the electron optical system 38, a vacuum gauge 90 and the like being respective elements of the present apparatus are configured to be connected to the control means 501 so as to be able to transmit/receive their operations and detected signals and control the sequence with a processor included in the control means 501. For interface with a user and indication of SEM images, a display 500 can be used.

Even causing the electron source to emit electron by application of 2 kV with the above described control means and causing the electron gun to emit electron beam, the degree of vacuum did not vary much, and, the degree of vacuum inside the electron gun column 2 maintained the level of $10^{-8}$ Pa.

The nonevaporative getter pump has property of dropping the pumping speed as absorption amount increases, but increasing the pumping speed by (1) adopting differential pumping system, (2) combined use of it with a sputter ion pump and (3) a sheet-shaped nonevaporative getter pump, the degree of vacuum can be maintained without dropping over a long period of around 3 to 4 years.

Figure 15:
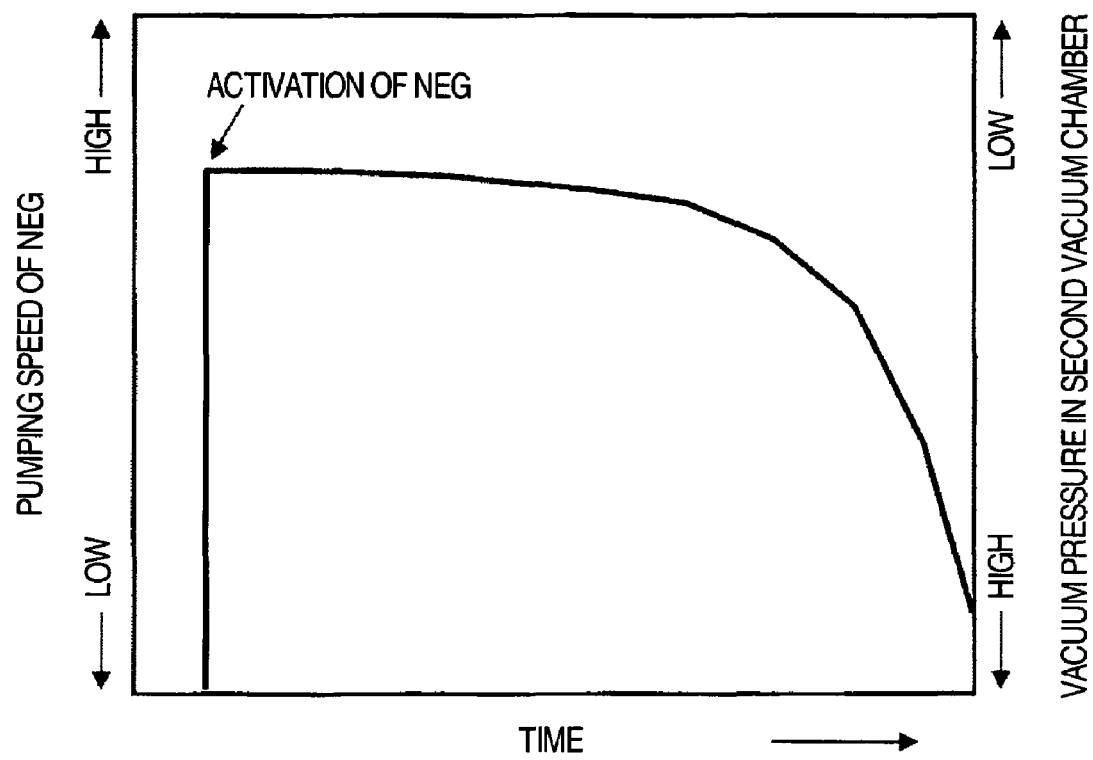
FIG. 15 is a view for explaining a pumping speed property of a nonevaporative getter pump.

As the other functions, by monitoring the above described degree of vacuum, a function to notify a user of a replacement time of the nonevaporative getter pumps 3 and 5 can be added. Since a relationship between the pumping speed and the elapsed time of the nonevaporative getter pump indicates a gradual curve as shown in FIG. 15, the replacement time of the nonevaporative getter pump can be notified on the safe side. As the configuration, it is advisable that the second vacuum chamber 86 is provided with a vacuum gauge 90 to send data to the control means 501 and to indicate arrival of the replacement time in the user interface such as a display and the like at the point of time when the degree of vacuum in the column becomes a preset one.

Figure 4:
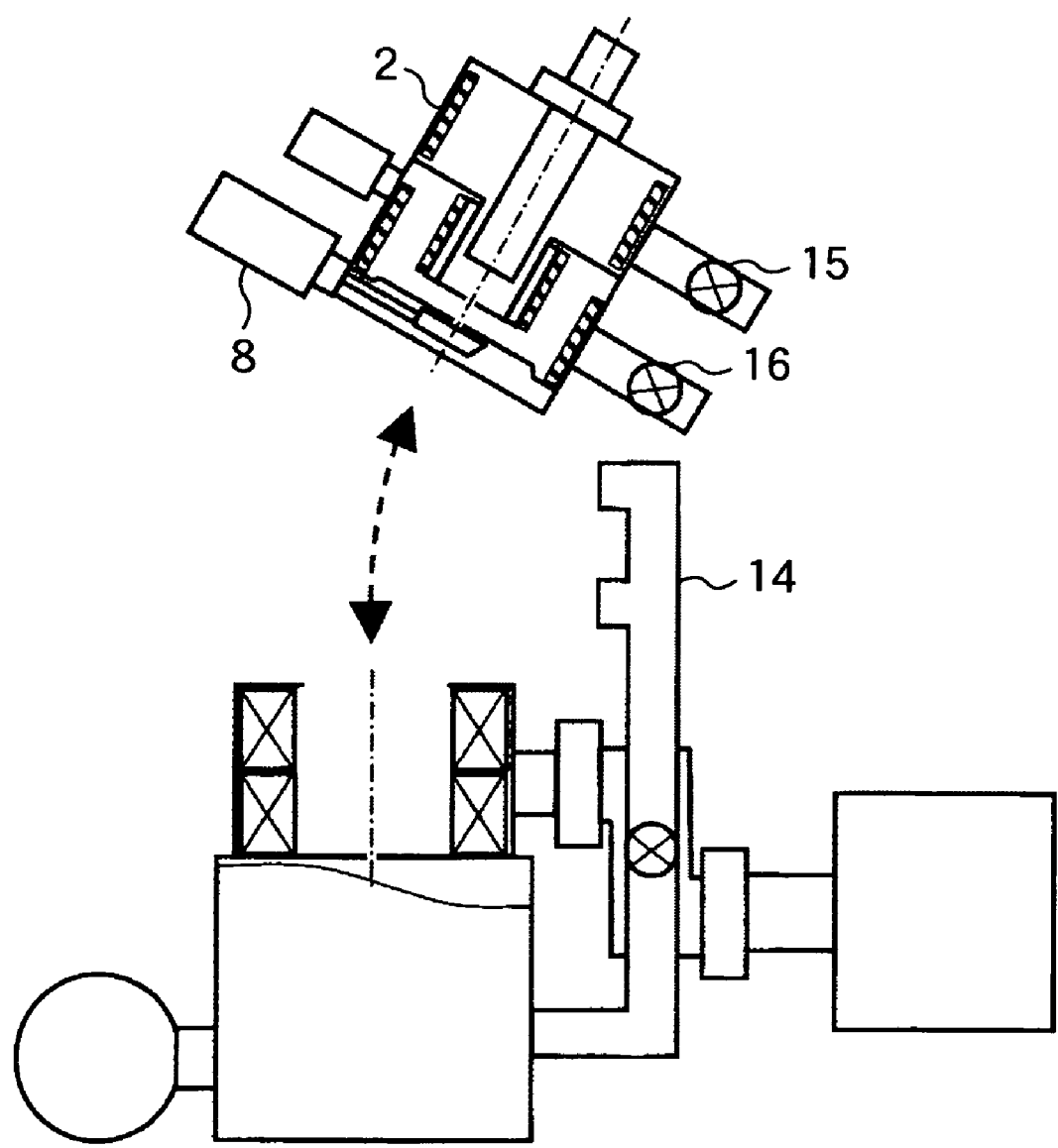
FIG. 4 is a view for explaining the holding of high vacuum in an electron gun part during maintenance.

Moreover, the other effects of the present invention in the present embodiment will be described. In FIG. 4, in case of carrying out maintenance of the apparatus, it is necessary to avoid leakage of the atmosphere pressure into the electron gun portion 2 maintaining the highest degree of vacuum to, thereby, shorten the down time. For that purpose, the gun-valve 8 is provided.

In the present embodiment, when this gun-valve 8 is closed, the degree of vacuum of the electron gun part can be maintained without requiring energy supply at all, and the downstream part is opened to the atmosphere so that maintenance will become feasible. On the other hand, in the conventional cases, as shown in FIG. 2, as many as three units of ion pumps are installed, one for the electron gun chamber 10, one for the intermediate chamber 11 and one for the electron optical system chamber 6, and thus, the weight is not less than 100 Kg, therefore making maintenance as dangerous work, and, high voltage of about 5 kV must be kept supplying to each ion pump (IP-1, 2 and 3) in order to maintain high vacuum state, which embraces a problem that the maintenance is failed in making the work handy.

In the present embodiment, as shown in FIG. 4, when closing the valves 15 and 16 of the rough pumping port 14 and the gun-valve 8, the electron gun part can be removed still in a high vacuum state. Moreover, the ion pumps shown by the broken line in FIG. 3 that used to be present in the electron gun 2 in the prior arts are excluded and the weight is lightened to reach about 15 kg, and no supply of high voltage is required, therefore giving rise to a conventionally unattainable effect of allowing maintenance by hand without risk.

Figure 2:
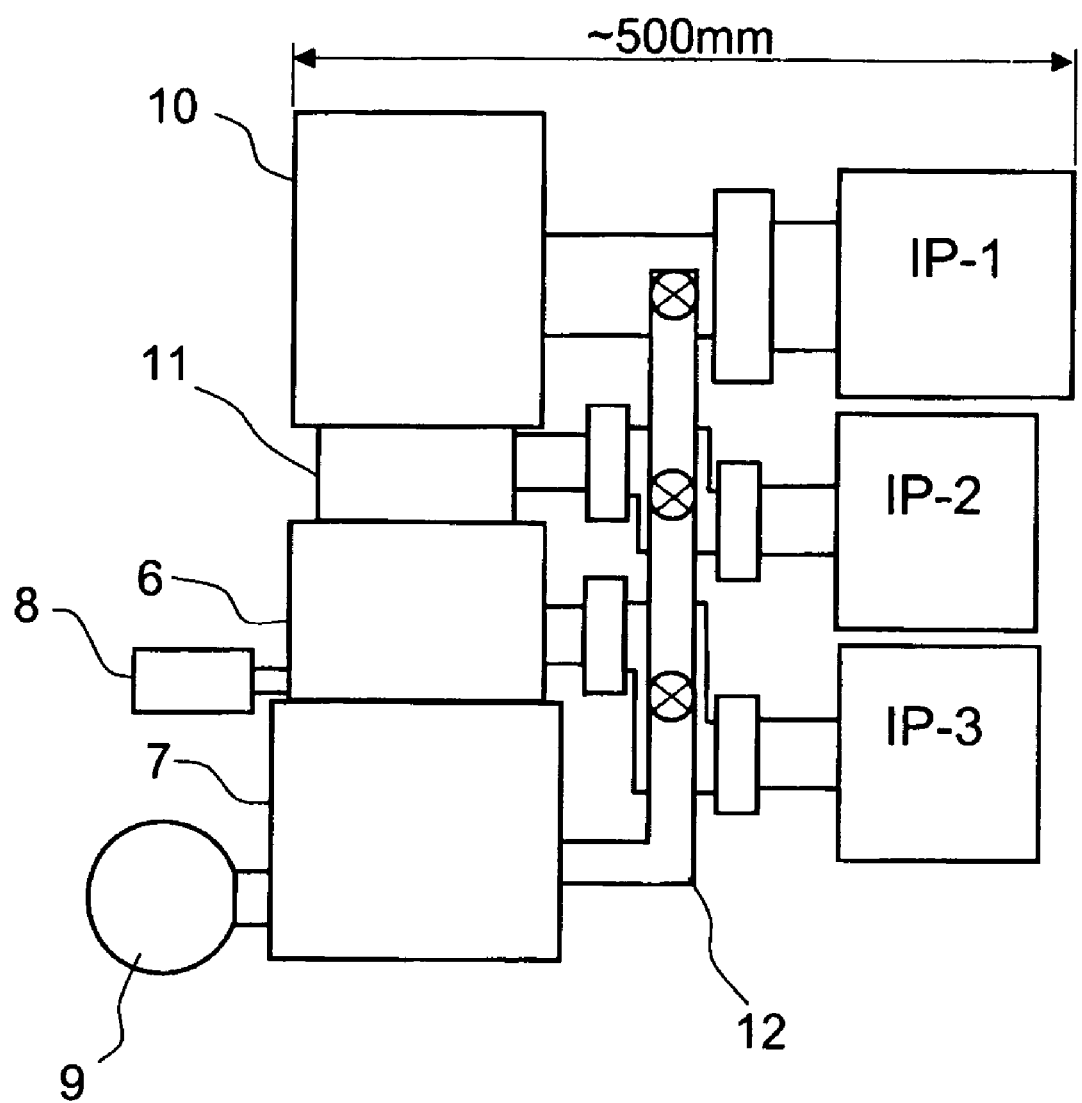
FIG. 2 is a view for explaining a configuration of a conventional scanning electron microscope apparatus.

In the apparatus shown as the prior art in FIG. 2, the gun-valve was attached at a location where the aperture between the electron optical system chamber 6 and the sample chamber 7 is opened/closed. This is the reason why the vacuum chamber pumped with the ion pump does not expose to the atmosphere. However, in the present invention, as will be described below, the gun-valve 8 is provided between the second vacuum chamber 86 and the electron optical system chamber 6 being the third vacuum chamber 87 in order to make it possible to remove still in high vacuum the part of the electron source 1 which is the last one to be desired not to be exposed to the atmosphere.

It is desirable that the above arrangement allows the life of the electron source to be kept long as well as the life of the nonevaporative getter pump, and the maintenance performance to be improved.

In the present embodiment, the ion pump was used as a pump to be used together with the nonevaporative getter pump, but a turbo-molecule pump may be used instead of the ion pump. However, in case of the turbo-molecule pump, since according to its mechanism, the blade rotating at the time of vacuum pumping operation oscillates during operation, disposition near the electron gun gives rise to a problem such as a waggle of SEM image and the like. Therefore, as the pump to be combined, the ion pump or the vacuum pumping apparatus with less occurrence of vibration in terms of mechanism is more preferable.

So far, the present embodiment is described with the scanning electron microscope as an example, but it goes without saying that it is applicable to a transmission electron microscope, an electron beam writing apparatus and respective kinds of charged particle apparatus as well.

Embodiment 2

A magnetic-field-superposed electron gun is effective technology that generates a magnetic field around the electron source 1 and thereby depending on designing, can reduce chromatic aberration, spherical aberration and the like and moreover can increase beam current, and therefore application, in particular, to critical dimension SEM and inspection SEM and the like on semiconductor leads to improvement in measuring accuracy, resolution and through put. In other words, by superposing magnetic field, parameters of the electron optical system can be increased to expand the degree of designing freedom. That is, use of the magnetic-field-superposed electron gun means possibility of radiating large current with low aberration. However, the ion pump, the magnetic shield, the coil for generating magnetic field and the like will become bulky to give rise to a problem to be big sized and increase in weight.

Figure 5:
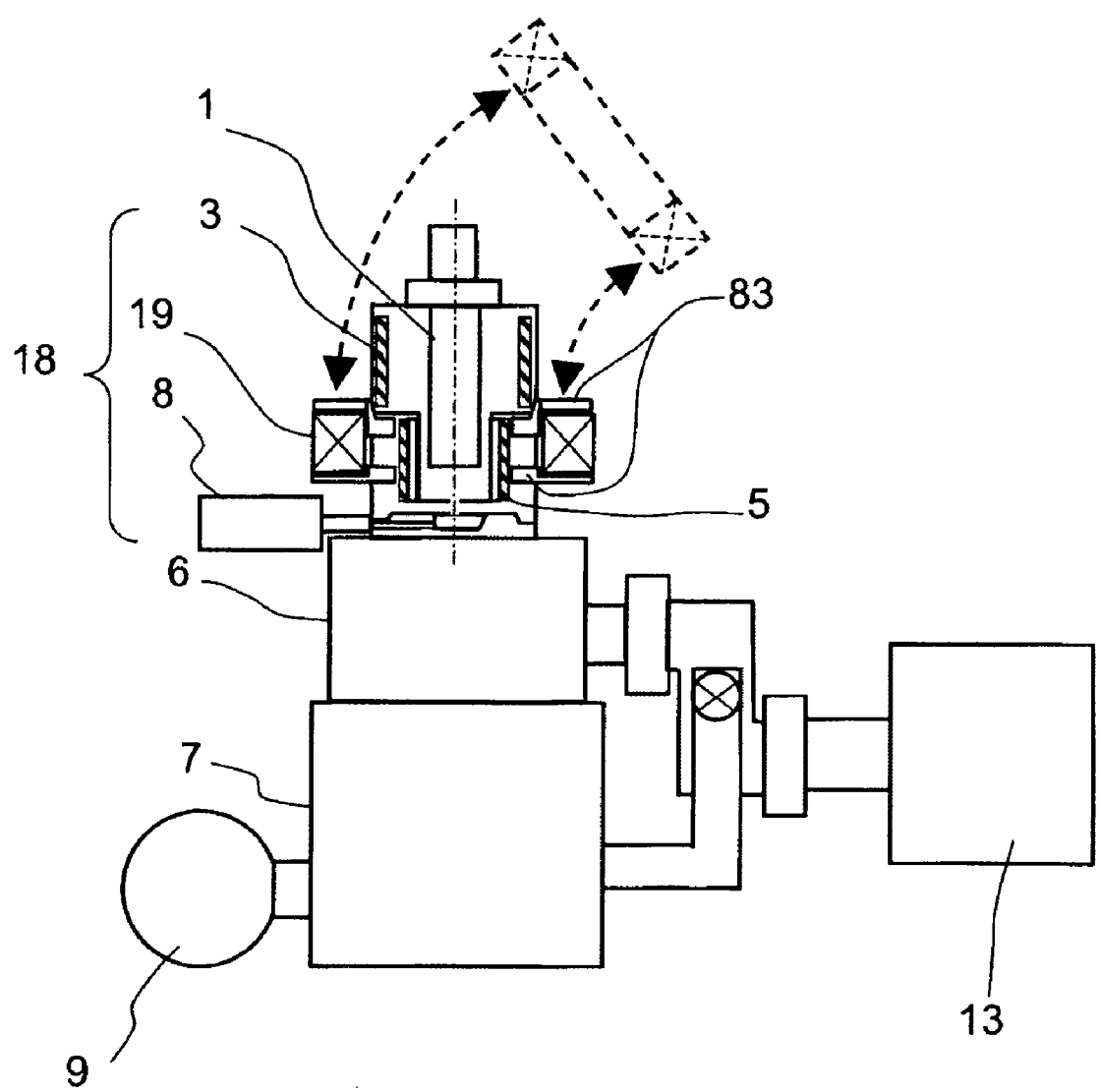
FIG. 5 is a view for explaining an example of applying the present invention to a magnetic-field-superposed electron gun.

Application of the present invention to the magnetic-field-superposed electron gun will make an electron gun ion-pumpless and compact easily, deriving such an effect that employment of magnetic-field-superposed electron gun can be employed without difficulty. In the present embodiment, an example with a magnetic-field-superposed electron gun having been applied to the present invention will be described. FIG. 5 shows a schematic configuration of the present embodiment.

In this drawing, only the portion of a magnetic-field-superposed column 18 is indicated in a sectional view and appearance is indicated for the other portions. The present apparatus is the one where the electron gun column in FIG. 1 has been replaced by magnetic-field-superposed column 18 in the present embodiment, and for the other means and functions are likewise those in FIG. 1. This magnetic-field-superposed column 18 includes, likewise the electron gun column, the built-in nonevaporative getter pumps 3 and 5 and has no ion pump. This magnetic-field-superposed column 18 is cylindrically shaped and provided with a ring coil 19 having inner diameter corresponding with this column's outer diameter detachably. Heat-resistant temperature of this coil 19 is about 100° C. at most, but since the coil 19 can be provided detachably, the heating temperature up to reach about 500° C. for activating the nonevaporative getter pumps 3 and 5 will become applicable and is convenient.

A magnetic guide 83 is present in the location where the coil 19 is disposed, and is used as a part to guide the magnetic field generated from the coil to the vicinity of the electron source 1.

A process of starting the present embodiment is approximately the same as Embodiment 1. It is advisable that the coil 19 is removed at first when startup commences and mounted after the vacuum state has started up so as to let it emit electron beam to adjust the coil.

In the prior art, the coil must be large-sized in order to avoid the ion pump and the detachable heavy devices used to reduce usability at the time of maintenance, but employment of the above described configuration of the embodiment derives such an effect that maintenance becomes possible simply and handily.

The present embodiment is described with the scanning electron microscope as an example, but it goes without saying that it is applicable to an electron beam writing apparatus and respective kinds of charged particle apparatus as well.

Embodiment 3

In the present embodiment, an example of application to a probing system with SEM will be described. The probing system with SEM, principles and configurations of which are described in JP-A-09-326425, is configured to cause a plurality of probes to contact a semiconductor circuit terminal directly to measure current-voltage property. Since the size of the circuit pattern has an order nanometer, nominal radius of the probe is about 50 nm and the front end to contact the circuit terminal is cuspidate up to reach a nanometer order. Accordingly, the probe occasionally contacts the circuit terminal too much so that excess pressure is applied to the probe even just a little, then the probe and the circuit terminal are damaged, which is a problem. In addition, in order to avoid risk of the probe damage, the probe used to be caused to approach a target slowly, giving rise to a problem that it takes too much time for a probe to contact a circuit terminal.

Therefore, in a conventional probing system with SEM, the probe and the circuit terminal are roughly aligned with an optical microscope in advance. Thereafter, the probe is moved in the Z direction to approach the circuit terminal. At that time, collision between the probe and the circuit terminal was avoided by using signals such as tunneling current and carrying adjustment in view of observation image on SEM. In addition, in the precise relative alignment of the probes and the circuit terminal, the positions were determined by viewing the image on the scanning electron microscope, but there was no information in the Z direction, giving rise to a problem that the alignment was time-consuming.

The probing system with SEM of the present embodiment is characterized by using a small electron optical system column and comprising two scanning electron microscopes to derive a configuration that makes image including information in the Z direction attainable. By watching the same field of view from different directions in angle, that is, by causing the two columns to make an angle (viewing angle), an image containing a positional relationship between the position of the circuit terminal in a sample surface and the position of the probe as well as information in the Z direction indicative of a height from the circuit terminal to the probe will become attainable.

Figure 6:
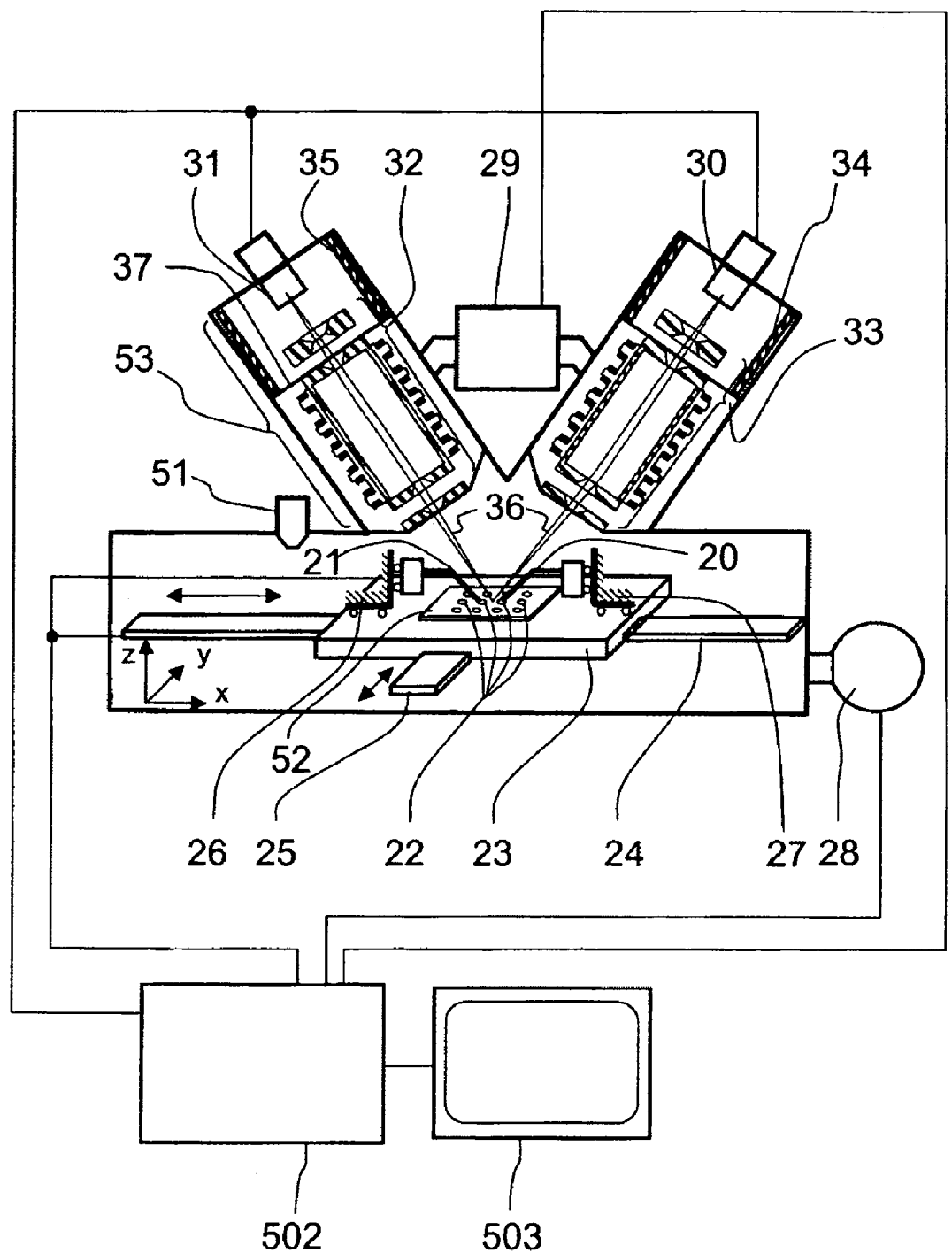
FIG. 6 is a view for explaining an example of applying the present invention to a prober apparatus.

FIG. 6 is a conceptual diagram showing a configuration of the prober apparatus of the present embodiment. A stage 23 mounting a sample 52 is provided inside a vacuum chamber pumped with a turbo-molecule pump 28. This stage can be moved and aligned along tracks 24 and 25 in two directions (X, Y). On this stage 23, a sample 52 is mounted and, in addition, probes 20 and 21 abutting upon a circuit terminal 22 on the sample surface and probe stages 26 and 27 are disposed. The probe stages 26 and 27 are provided with such a configuration that allows precise alignment of a probe on three axes in the X, Y and Z directions. In the present embodiment, there are two probes 20 and 21, but the number of probes will not be limited in particular, and may be for example, four probes may be present.

In the top part of the vacuum chamber, a pair of SEM columns 53 are disposed. The pair of SEM columns are disposed in a desired position orientated to the sample 52 with an angle, and disposed obliquely to the direction of a normal line of the observation sample surface. Electron optical systems 32 and 33 are provided inside the SEM columns 53 so that electron beam can be radiated to the sample. The electron beam 36 field-emitted from the field emitter type electron guns 30 and 31 inside the electron optical systems 32 and 33 is subjected to a focusing effect by electric field formed between respective electrodes of electrostatic lens consisting of a plurality of lens electrodes provided thereunder, focused thinly and radiated onto the sample. And concurrently, the electron beam 36 is scanned two-dimensionally on the sample. Secondary electron arising from the sample by radiation of the electron beam 36 reaches a secondary electron detector for detection. The secondary electron detector, not shown in the drawing, is disposed inside the SEM column 53. Out of this detection signal, two dimensional secondary electron image of the sample surface-is derived. The present embodiment is aimed at observation under low accelerating voltage that can reduce charge and damage on the sample surface due to radiation of the electron beam 36 so as to be suitable for application such as surface observation on a semiconductor. Therefore, the accelerating voltage Va of the electron beam 36 is set to not more than 3 kV (mainly around 1 kV). The present embodiment employed an electrostatic optical system as the electron optical systems 32 and 33 provided inside the SEM columns in view of easy miniaturization. Since the electron optical systems are configured only by the electrostatic lenses, the electron microscope cylinder is extremely compact with outer diameter of 34 mm and height of 150 mm. At the same time, high resolution of 6 nm at accelerating voltage of 1 kV could be realized. Here, in the present embodiment, the secondary electron detector is disposed inside the SEM column 53, but it may be provided outside the SEM column.

The respective elements described so far are connected to the control means 502 by signal cables so that operation control signals are transmitted and received. Signals of SEM image for the two sets of SEM columns 53 installed in the present embodiment are also transmitted to the control means 502 through these signal cables, and are synthesized into a stereo image, and then the image is indicated on the display 503. The derived image signals can be stored in recording means included in the control means 502 as well.

Moreover, above the stage 23, there is present an optical microscope 51-1 for rough alignment of the probes and the circuit terminal. This optical microscope 51-1 is located immediately above the sample and is used for rough alignment of the probes and the circuit terminal on the X, Y planes.

Figure 7:
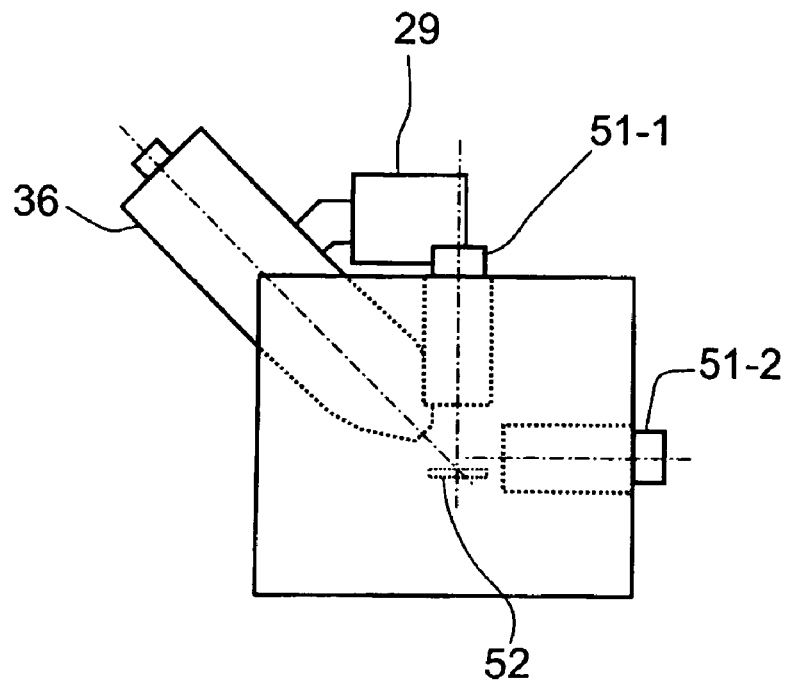
FIG. 7 is a view for explaining the apparatus side face when applying the present invention to the prober apparatus.

FIG. 7 shows a side view of the prober apparatus shown in FIG. 6. As apparent from this side view, the prober apparatus of the present embodiment is provided with an optical microscope 51-2 for rough alignment in the Z direction in addition to the optical microscope 51-1 for rough alignment in the direction on the X, Y planes. In addition, the SEM column 53 is mounted on the vacuum chamber so as to get inclined by a predetermined angle to the direction of normal line of the sample 52 or to the direction of the optical axis of the optical microscope 51-1 for rough alignment.

Figure 8:
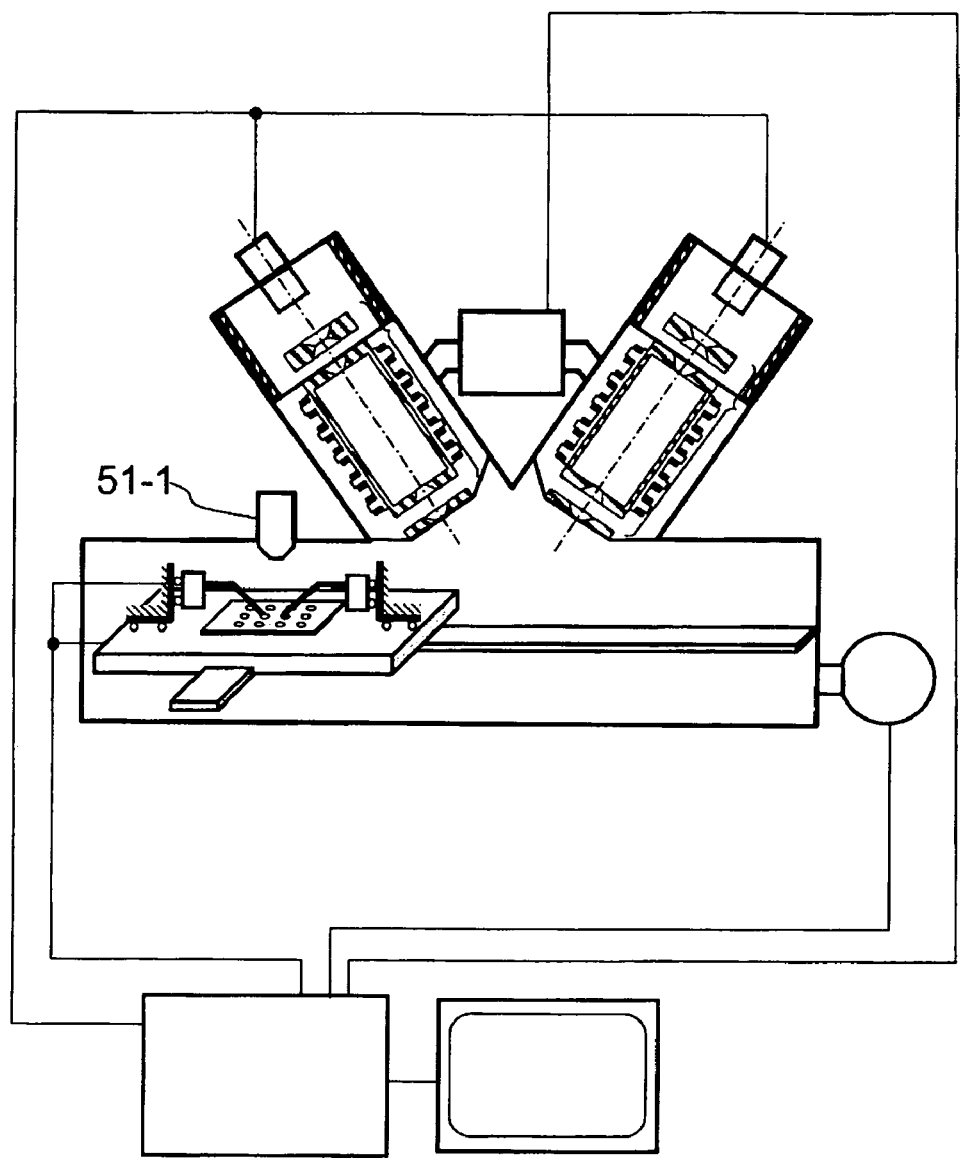
FIG. 8 is a view for explaining observed images of a probe and a circuit terminal when applying the present invention to the prober apparatus.

Next, operation procedure of the prober apparatus of the present embodiment will be described with reference to FIG. 8. The sample 52 is loaded onto the apparatus, and after vacuum pumping, the stage is moved under the optical microscope 51-1 to undergo rough alignment. Thereafter, as shown in FIG. 6, the stage is moved to the irradiation position of the electron beam 36 so that the probes 20 and 21 and the circuit terminal 22 undergo fine alignment. That is, while observing image data of the two scanning electron microscopes, the probes 20 and 21 and the circuit terminal 22 are aligned and caused to approach each other and to stop just before contact. In order to observe relative positional relationship between those probes and the circuit terminal, it may be manually operated or automatically controlled based on the image data. Subsequently, they may be brought into contact based on the result of measurement and observation on tunneling current and SEM image. Then, they may be contacted to each other on the basis of the measurement and the observed result of the tunneling current and the SEM image. Thereafter, the sample stages 23 and the probe stages 26 and 27 are moved and are aligned so as to cause the probes 20 and 21 to enter the vision of the two sets of scanning electron microscopes 32 and 33.

Figure 9:
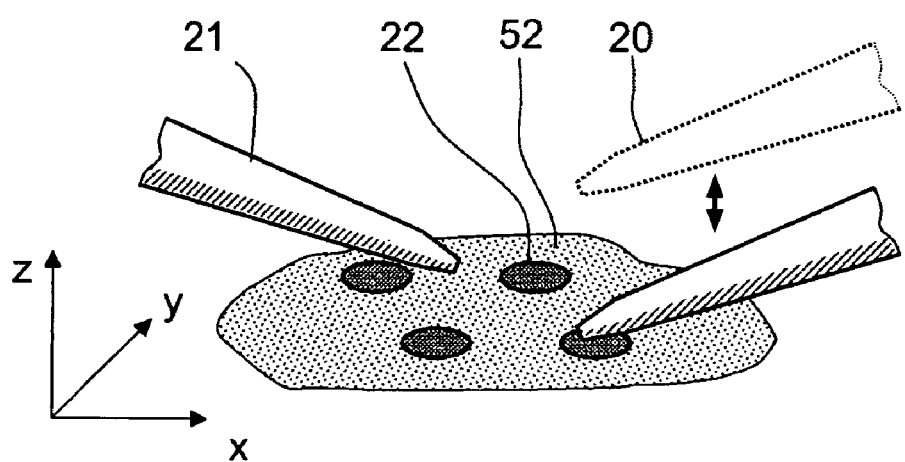
FIG. 9 is a view for explaining rough alignment when applying the present invention to the prober apparatus.

FIG. 9 shows a schematic view of an SEM image attainable with a prober apparatus of the present embodiment. A conventional prober apparatus could derive only an SEM image corresponding to a top view of a sample, but the prober apparatus of the present embodiment can attain a perspective three dimensional image as shown in FIG. 9. Thereby, alignment of the probes 20 and 21 and the circuit terminal 22 will become remarkably simple so as to reduce damage probability of the probes and the sample due to excess contact. Moreover, contact time of the probes can be shortened. By using data derivable from the two SEM columns, even if either one of them should break down, inspection will become feasible without damaging the probes and the sample. Here, damage probability of the probes and the sample can be reduced only with information derived from the image shown in FIG. 9, and when the contacts between the circuit terminal and the probes are confirmable based on tunneling current value and the like derived from the probes 20 and 21, benefit to an apparatus user is further improved.

Although a differential pumping system is not necessarily required to realize the apparatus configuration described above, it is necessary to use a plurality of ion pumps as shown in FIG. 2 in order to maintain the degree of vacuum around the electron gun in the SEM column. However, application of the differential pumping system having been described with Embodiment 1 and Embodiment 2 simplifies the configuration of the vacuum pumping system and thus, is much advantageous on apparatus designing.

With reference to FIG. 6, a configuration of a vacuum pumping system of a prober apparatus where a differential pumping system is applied will be described below. Inside the SEM column 53, an aperture plate 37 is provided and divided into two vacuum chambers different in degree of vacuum. One is a first vacuum chamber (electron gun chamber) where the electron guns 30 and 31 are stored and the other is a second vacuum chamber where the electron optical systems 32 and 33 are stored. The sample chamber provided under the SEM column 53 undergoes pumping with the turbo-molecule pump 28, the second vacuum chamber undergoes pumping with the ion pump 29 and moreover, the electron gun chamber in the most upstream undergoes pumping with the nonevaporative getter pumps 34 and 35. Thereby, as compared with the conventional structure shown in FIG. 2, the electron gun chamber will become capable of maintaining a high degree of vacuum with a fewer number of ion pumps.

Further, in the prober apparatus of the present embodiment, two. SEM columns use one ion pump together so as to increase efficiency and save space. Moreover, when applying a sputter ion pump or a noble ion pump to the ion pump, the pumping efficiency of rare gas that is hard for the nonevaporative getter pump to pump increases, and therefore, it is advantageous for maintaining degree of vacuum.

Thus, it was not practical to deploy as much as two sets of scanning electron microscopes for monitoring since a convention small scanning electron microscope require a plurality of ion pumps, but the present embodiment can realize a prober apparatus having a configuration capable of obtaining a three dimensional image in a smaller space than that in the prior art. In the present embodiment, there is described an example of having inspected the circuit terminal as an inspection subject for the prober apparatus, but it goes without saying that the inspection subject may include not only the circuit terminals but also fine electronic circuits in general such as wiring parts, electrodes, memory cells and the like of a circuit. A semiconductor wafer, a chip or a sample substrate where a circuit pattern has been formed or a sample piece derived by cutting a sample substrate and taking out a part thereof can be used for a sample having an inspection subject inside.

Embodiment 4

Figure 10:
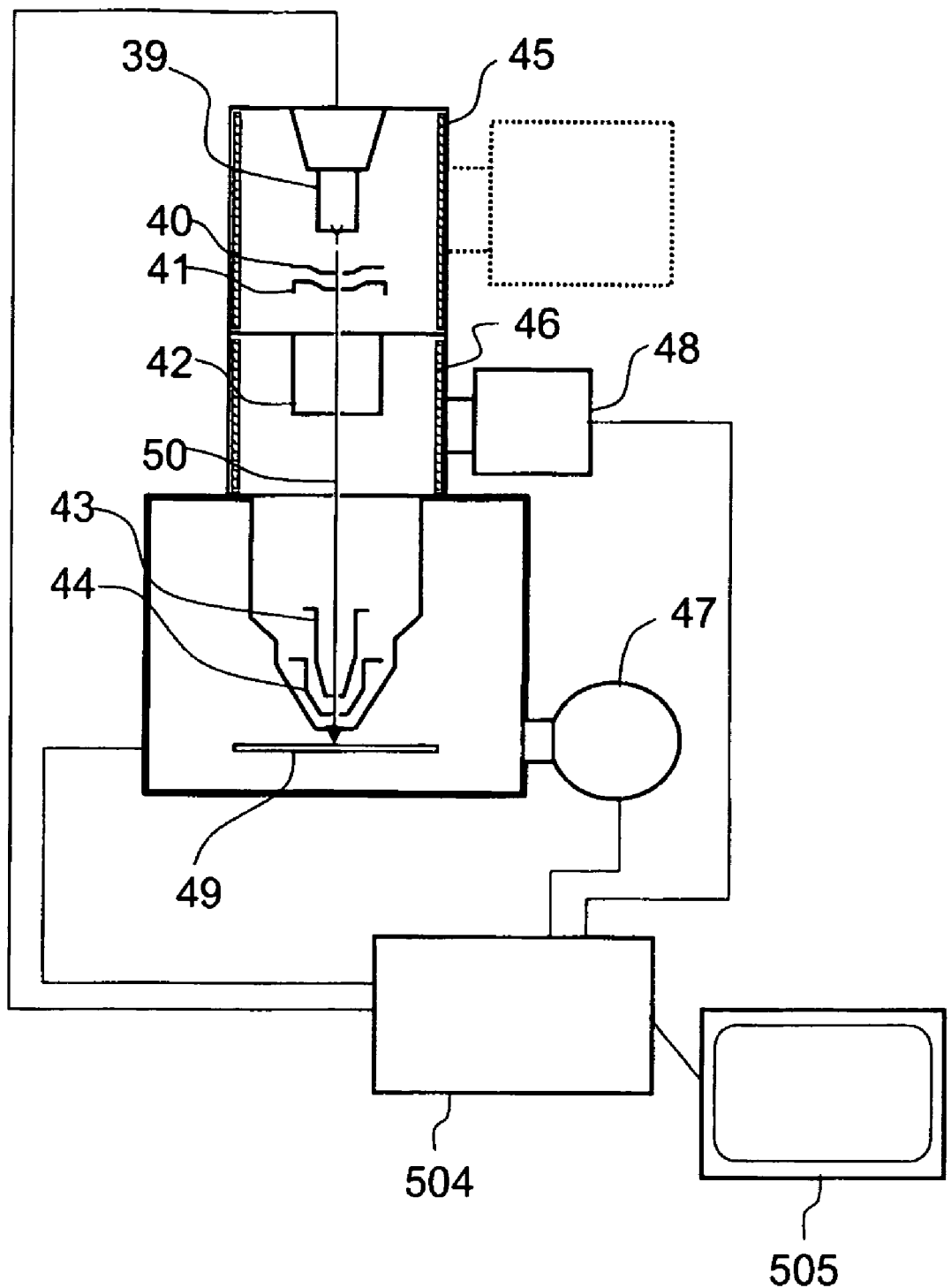
FIG. 10 is a view for explaining an example of applying the present invention to a focused ion beam apparatus.

With reference to FIG. 10, an embodiment where the present invention has been applied to a column of a focused ion beam (FIB) apparatus will be described. The FIB apparatus is an apparatus for emitting ion particles heavier than electron to a sample 49 to process the sample surface, and for detecting electron arising from a site where the ion beam has been radiated to observe an image and the like, likewise the SEM.

Also in an FIB apparatus, a conventional apparatus includes an ion pump indicated by a broken line as shown in FIG. 10, two or more in total in number. Therefore, application of the present invention can attain miniaturization around the FIB column without difficulty likewise Embodiment 1.

In an optical system focusing the ion beam 50, an electrostatic optical system consisting of a plurality of electrodes 40, 41, 42, 43 and 44 is used, and therefore, no electro magnetic lens in use of a coil as the SEM is used. Consequently, since heat resistance can be made higher than that of SEM, there are characteristics that the nonevaporative getter pumps 45 and 46 are suitable for adoption.

It is necessary for an ion source 39 of the FIB apparatus to be disposed in the most upstream and maintain a degree of vacuum around $10^{-8}$ Pa. Therefore, likewise the SEM having been described in Embodiment 1, differential pumping system is adopted. In case of FIG. 10, two step differential pumping is implemented and conventionally two ion pumps were used. By replacing one ion pump on the upstream side thereof, indicated by a broken line, with the nonevaporative getter pump 45, the embodiment can attain miniaturization and weight saving. Moreover, when applying a sputter ion pump to the ion pump, pumping efficiency of rare gas that is hard for a nonevaporative getter pump to pump increases, and further miniaturization can be derived, which is desirable.

In addition, as described above, since the ion beam is focused by the electrostatic optical system, the nonevaporative getter pump 46 can be disposed in the column part pumped with the ion pump as well. This gives rise to an effect that the pumping speed can be increased.

Here, the vacuum state in the sample chamber where the sample 49 is pumped out with a turbo-molecule pump 47. The above described respective elements are connected to the control means 504 by signal cables to allow transmission/reception of control signals and image data so that the sequence of the entire apparatuses can be managed. For interface with a user and display of images, a display 505 can be used.

The other structures are similar to those in the conventional FIB, and no detailed description thereon will be made here, but employment to apparatuses other than the electron beam apparatus is feasible.

Embodiment 5

Figure 11:
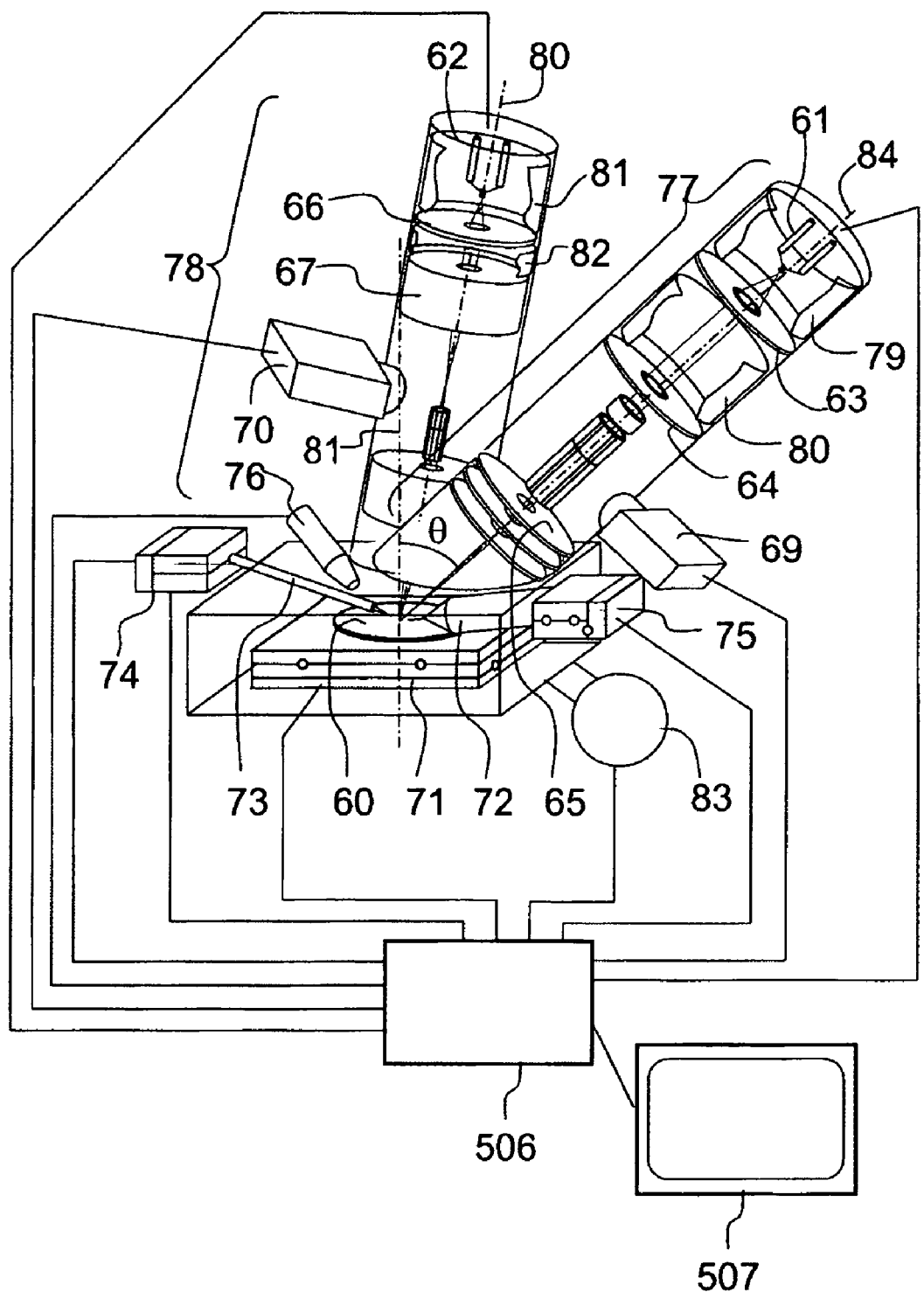
FIG. 11 is a view for explaining an example of applying the present invention to a micro sampling apparatus.

In the present embodiment, an example where the present invention has been applied to a micro-sampling system will be described with reference to FIG. 11.

A micro-sampling system is an apparatus of cutting off a portion of a device for inspection and analysis of semiconductor device and the like to observe and analyze the section, and is an apparatus provided with two types of columns mutually inclined at an angle, one being FIB column 77 for allowing sample cutting and the other being SEM column 78 for observing cutting position and a section to be cut simultaneously. Moreover, they impart a predetermined angle with respect to the vertical axis 81 to the surface of the sample 60 which is corresponding to the horizontal plane. Therefore, the two columns will be obliquely mounted closely to each other. Such a configuration used to give rise to such problems that a plurality of ion pumps conventionally mounted to respective columns interfered with each other or the center of mass got higher due to the weight of the ion pump to make the entire column apt to oscillate.

Since the present invention has been applied to the micro-sampling apparatus of the present embodiment, the both columns in FIB and SEM only use one ion pump each. Thereby, dramatic weight saving is derivable as compared with two or three units per column for a conventional configuration. Moreover, when employing a sputter ion pump or a noble ion pump for the ion pump, pumping efficiency of rare gas that is hard for a nonevaporative getter pump to pump increases, and therefore, further miniaturization can be derived, which is desirable. In the present embodiment, the FIB column and the SEM column are provided with separate ion pumps, but may use a single ion pump together.

An ion source 61 is present in a most upstream vacuum chamber of the FIB column 77 and a nonevaporative getter pump 79 is disposed there. Moreover, a nonevaporative getter pump 80 is also present in a downstream vacuum chamber partitioned by a wall with an aperture of the electrostatic optical system 63, and moreover, a vacuum chamber partitioned by a wall with an aperture 64 undergoes pumping with the ion pump 69. The ion beam emitted from the ion source 61 is focused onto a desired location on a sample surface so that predetermined removal processing can be carried out.

Likewise the FIB column, the present invention has been applied to the SEM column 78 as well. An electron source 62 is present in the most upstream vacuum chamber and a nonevaporative getter pump 81 is disposed there. A nonevaporative getter pump 82 is also present in a downstream vacuum chamber partitioned by a wall with an aperture 66, and a more downstream vacuum chamber undergoes pumping with the ion pump 70. Electro magnetic optical system 67 in use of a coil is present in this vacuum chamber and are less heat resistant. Therefore, no nonevaporative getter pump can be installed. The present configuration is the same as the SEM column having been described in Embodiment 1. Here, the electron beam emitted from the electron source 62 is focused on a surface of the sample 60 to cause secondary electron to arise. By detecting that secondary electron with a secondary electron detector 76, an SEM image can be derived regardless of midprocessing, preprocessing or postprocessing with ion beam.

The center axis 84 of the FIB column 77 is inclined and fixed to make an angle θ of 30 degrees with respect to the vertical axis 81. The center axis 80 of the SEM column 78 is inclined to make 45 degrees to the vertical axis 81. Moreover, relative angle between the FIB column and the SEM column is fixed to make 90 degrees.

A sample chamber is present under the above described two columns and undergoes vacuum pumping with the turbo-molecule pump 83. In addition, there are present a stage 71 where the sample 60 can be disposed, moved and aligned; arms 72 and 73 for micro sampling; and drive means 74 and 75 for driving them. Those micro sampling means are means for handling fine chips processed with ion beam.

The above described respective elements are connected to the control means 506 by signal cables to allow transmission/reception of control signals, image data and the like. For interface with a user and display of images, a display 507 can be used.

Embodiment 6

In the present embodiment, an example where the present invention has been applied to a sample inspection apparatus of a mirror electron microscope (mirror projection system) will be described. As an observation sample, semiconductor wafer, a chip or a sample substrate where a circuit pattern has been formed or a sample piece derived by cutting off a sample substrate and taking out a part thereof can be nominated. Mirror projection refers to a system to cause electron (mirror electron) reflecting electron beam, which is reflected near the sample surface without contact, based on electric potential distribution on the sample surface to form an image and detects the image, and is different from a normal SEM system that detects secondary electron or reflected electron arising from a sample subject due to radiation of a narrowly focused electron beam.

Characteristics of the mirror projection system is that, not by raster scan with single electron beam, but by mirror electron to a square region of about 100 to 400 μm length at a time, an image can be attained as an optical microscope, and therefore image obtaining time can be dramatically shortened.

However, this mirror projection system can derive no more than an image depending on the electric potential distribution on the sample surface. So, the mirror projection system does not form a direct image of the shape of the sample surface. Therefore, if the image of the region detected with mirror projection can be detected as a real surface shape, it can be utilized as a reference image to the detection image of mirror projection and is convenient for defects inspection. For that purpose, an application that has another electron optical system, an enlarged SEM image of a site assumed to be abnormal is effective.

Figure 12:
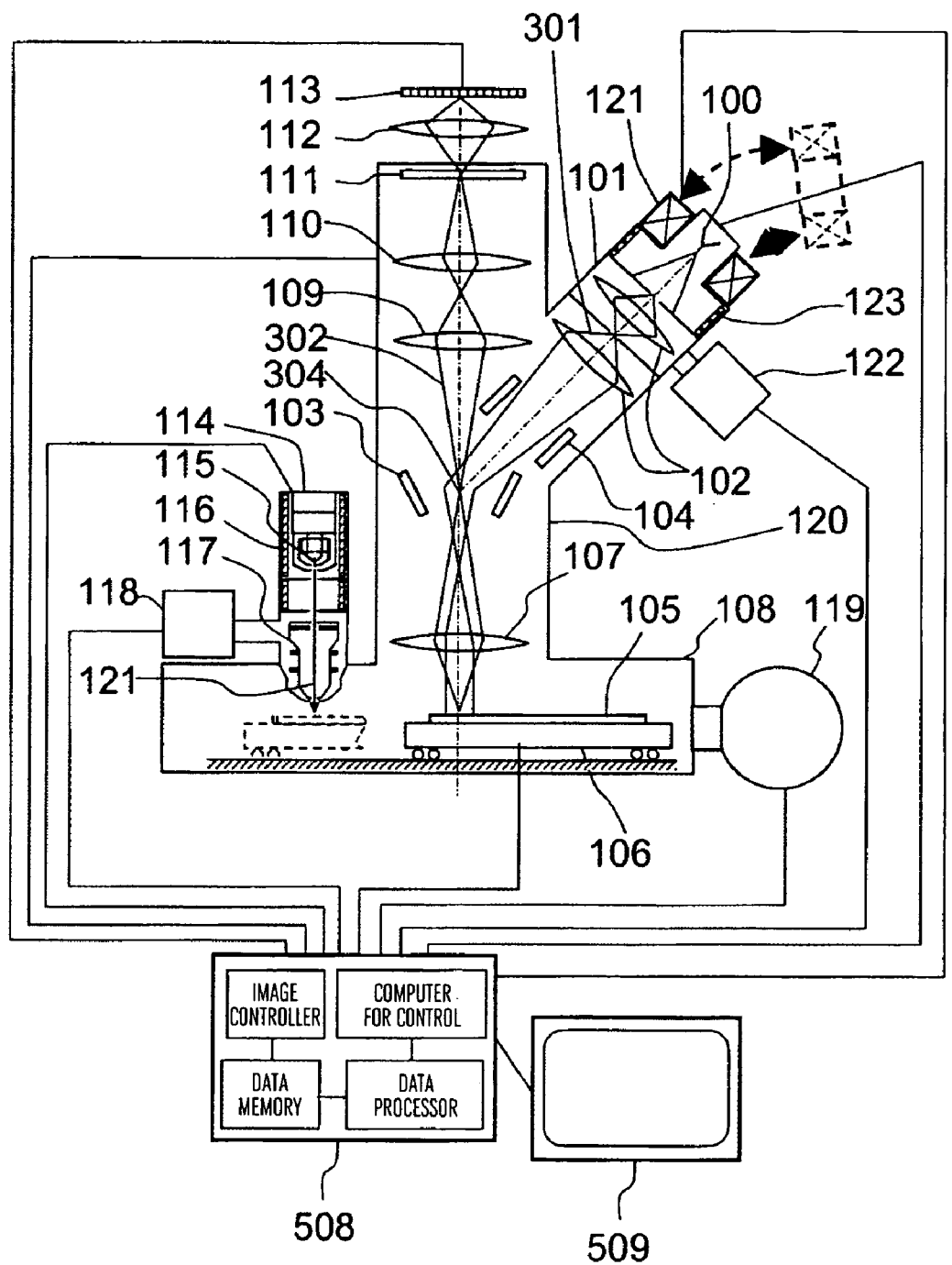
FIG. 12 is a view for explaining an example of applying the present invention to a mirror electron microscope type semiconductor inspection apparatus.

In the present embodiment, as shown in FIG. 12, a small SEM column 114 is provided beside a mirror projection column 120. Distance between those both columns is measured accurately in advance. A sample stage 106 mounting a sample (wafer) 105 is configured so as to be capable of moving in accordance with necessity between those both columns as indicated by a broken line.

Next, a configuration of the present apparatus and procedure at the time of inspecting the surface of the wafer 105 will be described.

In an electron beam condenser column 101, electron beam emitted from an electron source 100 is focused by a magnetic-field-superposed coil 121 and is emitted as beam imparting a large current. This large current imparting significantly influences improvement in throughput of inspection. The reason thereof is that signal-noise ratio (S/N ratio) of mirror electron signals derived from a single large area radiation increases/decreases in proportion to current of electron beam to be radiated.

This magnetic-field-superposed electron gun may be equivalent to the one having been described in Embodiment 2. That is, it has a differential pumping structure partitioned by walls with apertures, and an electron source 100 is present in a most upstream vacuum chamber in which the pumping is carried out with a nonevaporative getter pump 123. A condenser lens 102 is in a vacuum chamber at the downstream side, in which the pumping is carried out with an ion pump 122. With this structure, the vacuum chamber where the electron source 100 is present is maintained to extremely high vacuum at the level of $10^{-8}$ Pa. To the atmosphere side, the magnetic-field-superposed coil 121 is mounted in a structure detachable from the electron beam condenser column 101. Employing such a structure, the number of ion pumps to be installed in the electron beam condenser column 101 can be reduced to one, and therefore, weight saving can be attained, giving rise to an effect to improve oscillation property of the entire apparatuses. Moreover, when employing a sputter ion pump for the ion pump, pumping efficiency of rare gas that is hard for a nonevaporative getter pump to pump increases, and therefore, further miniaturization can be derived, which is desirable.

The electron beam emitted from the magnetic-field-superposed electron gun is focused by the condenser lens 102 and is caused to radiate the sample approximately in parallel. A Zr/O/W type Schottky emitter has been used as the electron source 100. The structure can steadily form a uniform illuminated area by electrons which is a large current beam (for example, 1.5 µA) and has an energy range of 1.5 eV.

As a separator, an E×B deflector 103 is disposed in the vicinity of an image forming surface 304 of image forming electron beam 302.

In this disposition, aberration occurs in the radiation electron beam 301 at the E×B deflector. In order to correct this aberration, the configuration includes another E×B deflector 104 for correcting aberration to be disposed between the radiation system condenser lens 102 and the E×B deflector 103.

The electron beam is deflected to an optical axis perpendicular to the wafer 105 with the E×B deflector 103. The E×B deflector 103 has a deflecting effect only to electron beam coming from upward. The electron beam deflected by the E×B deflector 103 is formed to an illuminated area by electrons in the direction perpendicular to the sample (wafer) surface by an objective lens 107. Since the E×B deflector 104 corrects deflecting aberration of the separator E×B deflector 103, and a fine cross over is formed on the focused surface of the objective lens 107, the sample can undergo radiation of radiation electron beam 301 with a good parallel nature.

Negative potential approximately equal to or slightly higher than the accelerating voltage of the electron beam is applied, by a sample application power supply not shown in the drawing, to a sample (wafer) 105 mounted on the sample stage 106 inside the vacuum sample chamber 108. An electric field reflecting the shape of the formed semiconductor pattern and a state of charge is formed on the surface of the wafer 105. By means of this electric field, a most part of the illuminated area by electrons is drawn back immediately before collision to the wafer 105, and goes up in a direction and with intensity reflecting the pattern information of the wafer 105.

The drawn back electron beam undergoes focusing effect by the objective lens 107, and the deflector 103 as a beam separator imparts no deflecting effect to the electron beam having progressed from downward, and therefore directly goes up vertically, then subject to enlarged projection through the objective lens 107, an intermediate lens 109 and projection lens 110 to form an image of the surface of the wafer 105 on an image detector comprising a scintillator 111, an optical lens 112, a CCD 113 and so on.

On the other hand, a small SEM column 114 is present beside the (above) mirror projection column 120 to allow observation of the pattern shape on the wafer 105. A Schottky emitter type electron source has been used as the electron source 115. The emitted electron beam 121 scans the wafer surface with an electrostatic optical system 117 so that the secondary electron or reflected electron can be detected to derive an SEM image.

As for the vacuum state of the SEM column 114, the electrostatic optical system 117 undergoes pumping with a small ion pump 118 with pumping speed of about 10 liter/second and the upstream side undergoes differential pumping with the nonevaporative getter pump 116. This configuration has derived a degree of vacuum on the level of $10^{-8}$ Pa in the vicinity of the most upstream electron source 115. The sample chamber 108 undergoes pumping with the turbo-molecule pump 119 to derive a degree of vacuum of $10^{-3}$ Pa.

Figure 13:
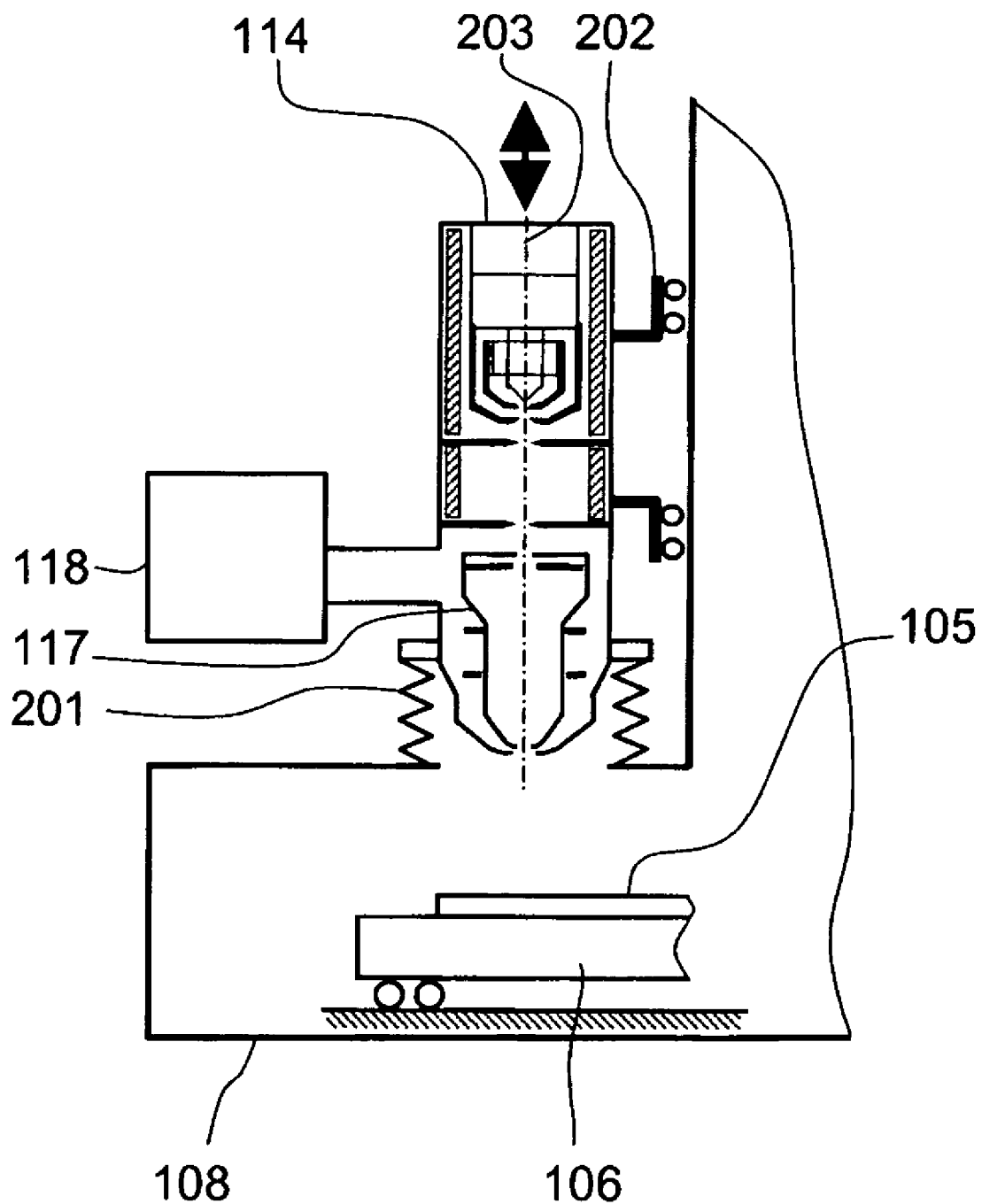
FIG. 13 is a view for explaining a configuration of the present invention which is applied to the mirror electron microscope type semiconductor inspection apparatus.

FIG. 13 shows a detailed configuration of a small SEM column 114. The sample chamber 108 is connected with the small SEM column 114 through bellows 201 so that alignment can be carried out with drive means 202 along the direction of the optical axis of SEM. Thereby, focus adjustment of the SEM optical system 117 becomes feasible and in addition, SEM observation vision can be expanded or narrowed, or selection of resolution will become feasible. That is, by taking distance (working distance) from the observation surface of the surface of the sample 105 long, the vision will be expanded but resolution will drop while, narrowing the working distance, the vision will be narrowed but resolution will be improved. Corresponding to an object to be observed, adjustment can be carried out freely, and it will become an extremely effective function. Measurement of the working distance is carried out with a position detector not shown in the drawing. Relationship between the optical property and the working distance of the small SEM is stored in a database in advance and adjustment is carried out automatically. Fine adjustment in view of the SEM image is also feasible.

The above described respective elements are connected with a control means 508 through signal cables. The control means 508 are a control unit of managing operations of the entire apparatus and comprise a signal interface transmitting/receiving control signals and image data; an image controller analyzing the detected image signals to detect defects; data memory storing the above described data base, information on the distance between the mirror projection column 120 and the small SEM column 114 and the like; a data processor processing information stored in the data memory; a computer for control of controlling operations of the entire apparatus and the like. In the present embodiment, there is indicated a configuration where all control means have been disposed inside the control means 508, but respective components may be disposed as separate control units. A detected image is indicated on a display 509, which is also used as user interface in case of using GUI (Graphical User Interface).

With apparatus configuration described above, change in local charging voltage on the surface of the wafer 105 as well as difference in structure such as concavity and convexity and the like thereon is formed as an image. By correcting aberration, radiation electron beam 301 with a good parallel nature can be radiated so as to form a mirror image with high resolution, and therefore, detection of the change of charging voltage as well as the difference in structure such as concavity and convexity and the like of not more than 100 nm will become feasible.

The detected image data undergo processing by the image controller and in the case where it is determined to be a defect, coordinate data memory thereof stores the data. When observing the surface shape on the detected defect position, an apparatus operator transfers the instruction indicating the corresponding SEM image to the control means 508 through the GUI indicated on the display 509. The data processor in the control means 508 makes reference to the data memory based on the signals inputted through the GUI to attain coordinate of a position that allows SEM observation. Thereafter, a control signal for a move to the attained coordinate, that is, the position, is transmitted to the sample stage 106. After the move to the desired position, the SEM image on the defective position derived from the mirror image is obtained and the data memory stores the required data such as presence/absence, shape, size and the like of the defect.

Thereafter, the sample stage is driven to return to the original coordinate position that allows mirror projection observation to continue and repeat inspection until inspection of a whole surface of the wafer is over, and then the inspection comes to an end. In the procedure described above, inspection by the mirror projection comes first and the found defect is confirmed with the SEM image afterwards, but on the contrary, the defect coordinate derived from SEM observation is stored at first and afterwards the mirror image may be observed. Or, after inspection of a whole surface of the sample with mirror projection is over, the SEM image may be obtained.

As described above, the mirror projection electron microscope apparatus of the present embodiment comprises two types of columns, a mirror electron column and a normal SEM or a reflection electron column, and can detect two image types, a mirror electron image and an SEM image or a reflection image. Accordingly, the SEM image or the reflection electron image can be utilized as a reference image to the mirror electron image, and thus benefit to an apparatus user is remarkably improved. This effect is realizable without applying the differential pumping system to the respective electron optical system columns.

Moreover, when applying the differential pumping system to any of the mirror electron column and the normal SEM or reflection electron column, the apparatus size can be made compact. Accordingly, without enlarging the size of the apparatus in its entirety, a sample inspection apparatus of mirror projection system that allows easy observation of the SEM image on a defective site can be realized.

Embodiment 7

Figure 14:
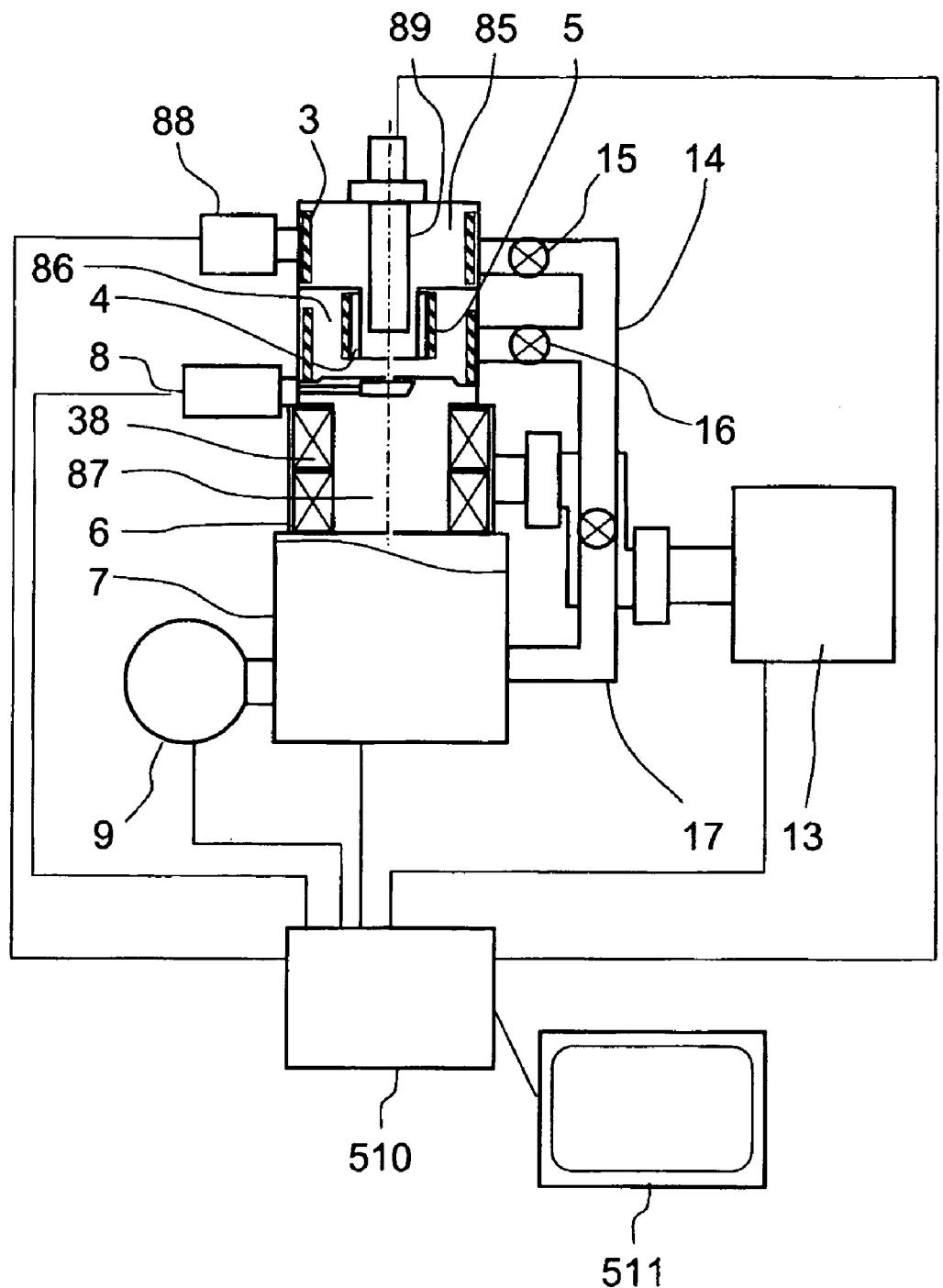
FIG. 14 is a view for explaining an example of applying another configuration of the present invention.

In the present embodiment, the other type of the present invention will be described with reference to FIG. 14. In the embodiment, the vacuum pumping of the fist vacuum chamber 85 in the configuration of the scanning electron microscope of the present invention described in Embodiment 1, is carried out by an ion pump 88 in addition to the nonevaporative getter pump 3 in a combined use.

Conventionally, in case of using a cold-cathode electron source (cold FE) 89, when ultimate degree of vacuum drops to reach a level of $10^{-7}$ Pa, it used to be a problem that contamination is attached in the circumference of the electron source to deteriorate electron emitting property or the life gets short. Therefore, it is necessary to implement flashing once in several months or six months. Flashing is a method of heating contamination film attached to the front end of the electron source by causing filament current to flow to clean it out. Thereby, electron beam with boosted brightness again is derived, but the beam emitting position at the front end of the electron source will be changed so that readjustment of the electron optical system is required, resulting in deteriorating handling. In order to solve those problems, it is necessary to maintain high the ultimate degree of vacuum of the vacuum chamber 85 where the electron source 89 is installed.

With the system described in Embodiment 1, the degree of vacuum of the first vacuum chamber where the electron source was present was on a level of $10^{-8}$ Pa, but the system of the present embodiment can attain the degree of vacuum on a level of $10^{-9}$ Pa. The reason thereof is that pumping of the nonevaporative getter pump 3 has removed almost all gas other than the gas such as argon and the like that is hard to be pumped out and moreover tiny remaining gas that is hard to be pumped out can be removed by the ion pump 88. Therefore, as the ion pump 88, the sputter ion pump, the noble ion pump and the like are suitable as described in Embodiment 1 and a compact type one with pumping speed of not more than 20 liter/second will do.

The above described respective elements are connected to the control means 510 by signal cables to allow transmission/reception of control signals and image data so that the operation of the entire apparatus can be managed. For interface with a user and display of images, a display 511 can be used.

In case of the present embodiment, a vacuum gauge for monitoring the life of nonevaporative getter pumps 3 and 5 is not required but monitoring of the voltage applied to the ion pump 88 will do to note the degree of vacuum. It is advisable to transmit, to the control means 510, data indicating the degree of vacuum of the ion pump 88 so that the user interface of the display 511 displays the arrival of expiration date at the point of time to reach a preset degree of vacuum.

As described above, the first vacuum chamber 85 comprises the ion pump 88 with the nonevaporative getter pump 3 in combined use, and thereby the degree of vacuum around the electron source 89 increases dramatically. Therefore, maintenance such as flashing that was required in case of using the cold-cathode electron source will be no longer necessary, which could derive a significant effect that continued use over 3 to 4 years that is the life duration of the cold-cathode electron source 89 became feasible.

Embodiment 8

In the present embodiment, an example where the present invention has been applied to a small magnetic-field-superposed electron gun will be described. At first the magnetic-field-superposed electron gun will be described. The magnetic-field-superposed electron gun is an electron gun comprising a magnetic-field-superposed electron source with an electron source being dipped in a magnetic field; an upper magnetic pole; and an underneath magnetic pole, said upper and underneath magnetic poles doubling as means for applying an electric field for extracting electron beam from the electron source and means for applying magnetic flux to the electron source, wherein potential difference is imparted between the upper magnetic pole and the underneath magnetic pole to generate an electric field therebetween.

Figure 16A:
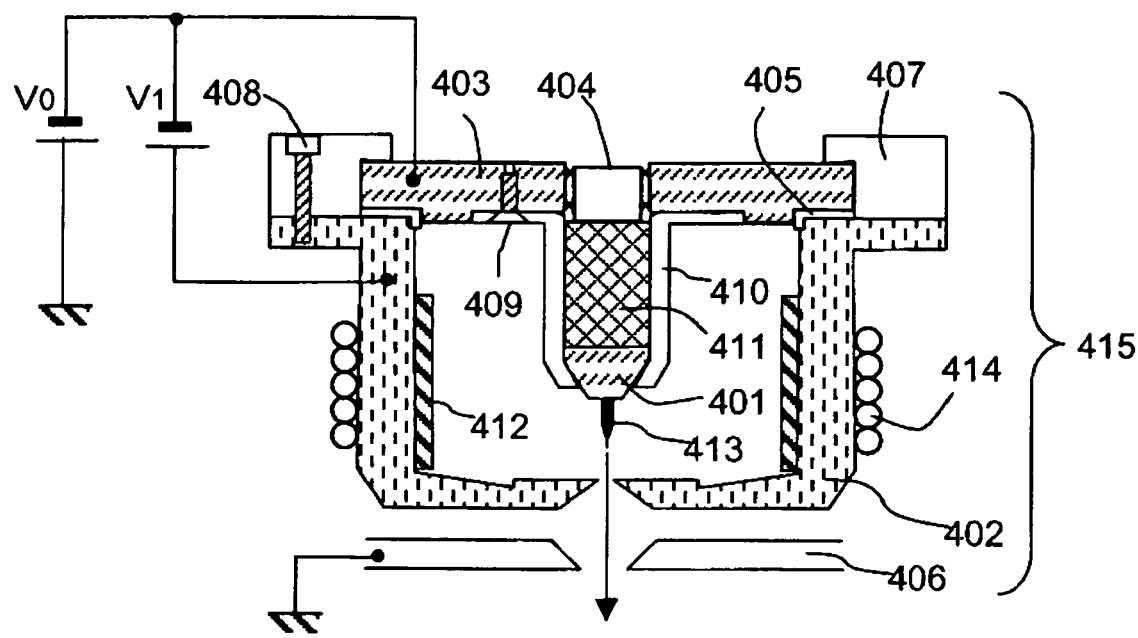
FIGS. 16A and 16B are views for explaining an example of applying the present invention to a small-sized magnetic-field-superposed electron gun using a permanent magnet.

FIG. 16A shows a sectional view in the circumference of an electron source in a small magnetic-field-superposed electron gun of the present embodiment. In FIG. 16A, differences of voltages $V_1$ applied to the upper magnetic pole 401 and the underneath magnetic pole 402 generates an electron extractor electric field to the electron source 413. In addition, since the upper and underneath magnetic poles double as extractor electric field applying means (extractor electrodes), aberration of the small magnetic-field-superposed electron gun 415 in its entirety can be made less. The reason thereof is that the magnetic field is generated within a part nearest to the electron source, that is, between the extractor electrodes, and thereby, strong magnetic field is derived in the narrow area and consequently an electron lens with short focus length is formed in the vicinity of the electron gun. This is derived by utilizing the tendency in the electron optics that shorter focus length makes aberration less.

In the present embodiment, electromagnetic coil is not used as a magnetic field generator but a permanent magnet is used, and carbon nanotube is used as an electron source. As the magnetic field generator, it is preferable to use a permanent magnet 411 disposed inside the same vacuum chamber where the above described electron source is present. As a magnetic flux generator, coil can be used, but when using a permanent magnet, it is advantageous that a permanent magnet having an extremely small volume can be applied to generate magnetic flux of around 0.8 to 1.1 T (tesla) practical as an electron lens. In order to impart a magnetic field to the electron source 413, the above described electron source is connected with the above described magnetic filed generator directly or through a magnetic pole made of soft magnetic substance. The shape of the above described permanent magnet 411 is disposed to form approximately axisymmetric shape with respect to the electron emitting direction viewed from the forward end of the electron source as the center axis. Consequently, magnetic polarization will become axisymmetric to this center axis direction or radius direction so as to derive an axisymmetric magnetic field being ideal as an electron lens with low aberration.

The above described permanent magnet or potential applied to the above described magnetic pole is used equally to that of the electron source or the extractor electrode. Therefore, since the magnetic pole as well as the permanent magnet generating magnetic fields and the electrode generating electron extracting electric-fields can be formed in the same small space, a strong magnetic field can be derived in a small area.

The electron source 413 to be combined with the above described electron gun 415 is preferably a light source with a diameter of imaginary source being as small as possible, and in particular, combined use with an electric field emitting electron source with physical diameter of not more than 100 nm at the forward end of the electron source can take the characteristics of the present invention with less aberration into advantage sufficiently, and an electron gun more sophisticated than the prior art will become realizable.

Figure 16B:
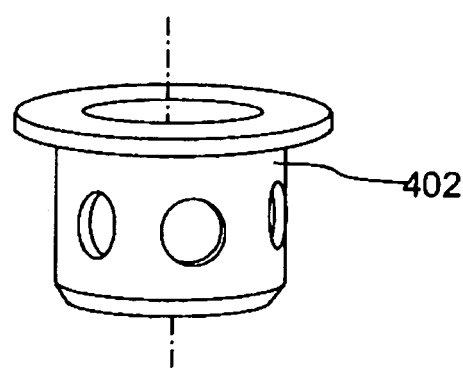

The configuration shown in FIG. 16A will be described further in detail. A bar-shaped permanent magnet 411 is disposed on the optical axis of the electron source. By using the magnetic field generated on the end surface of the slim bar-shaped magnet magnetized in the longitudinal direction, aberration of the electron gun is reduced to attain boosted brightness. The underneath magnetic pole 402 is fixed to a insulator 407 with screw bolts 408 and a base magnetic pole 403 and an isolator 405 are sandwiched between the both parties and fixed. This underneath magnetic pole also functions as an extractor electrode. The permanent magnet 411 is fixed, together with the upper magnetic pole 401, inside a magnet holder 410 with a magnet holding member 404. This magnet holding member has a screw formed in the outer periphery and is meshed with the female screw of the base magnetic pole 403. In addition, the magnet holder 410 is fixed to the base magnetic pole 403 with a flat head screw 409. In that case, no coil or no magnet that used to be used conventionally is present on the side wall of the underneath magnetic pole 402, and therefore, it is possible to provide an opening or openings as shown in FIG. 16B. The nonevaporative getter 412 is disposed on the inner wall side of the side wall where the opening is provided and the side wall outer portion is wound with a heater 414. When the heater heats with power dispatching, the nonevaporative getter is activated to work as a vacuum pump. By providing on the side wall of the underneath magnetic pole 402 with the opening, conductance of vacuum pumping increases, which is advantageous to retain the circumference of the electron source 413 in a good state with less gas molecules for long hours.

As the electron source, an example in use of a carbon nanotube was described, but another electron source may be used if it has the light source diameter of the electron emitter or the diameter of imaginary source of around 3 nm or smaller. For example, W tip with the top diameter of not more than 100 nm or the one with a nano-tip at this tip has also small light source diameter, and thus, a likewise effect is derived. The nano-tip is formed to have a protrusion of a level of several atoms at top of the tip by heating the W-FE tip and applying positive voltage thereto to derive electric field evaporation condition. Here, high-melting point metal such as Pt, Mo and the like other than W may be used.

Practically, the extracting voltage $V_1$ at the time of operation of the electron source 413 is determined within the range of 100 V to 4 kV in case of electron source of carbon nanotube, and within the range of 2 kV to 5 kV in case of W tip with top diameter of 100 nm so that emission current $I_e$ reaches a desired value while the $I_e$ from the electron source is observed. Practically, this $I_e$ is selected from the range of 10 nA to 500 µA in case of carbon nanotube and from the range of 10 nA to 30 µA in case of a W tip. The upper magnetic pole 401 has the same potential as the electron source 413 and acceleration voltage of $V_0$ is applied. Practically, $V_0$ is selected from a range of –30 kV to –30 V for an SEM (scanning electron microscope) and from a range of –30 kV to –1000 kV for a TEM (transmission electron microscope).

As having been described so far, by using an electron source with tip of not more than 100 nm and utilizing a permanent magnet, a magnetic-field-superposed electron gun can be realized, which is compact and light and can alleviate energy consumption since no electromagnetic coil is used.

Figure 17:
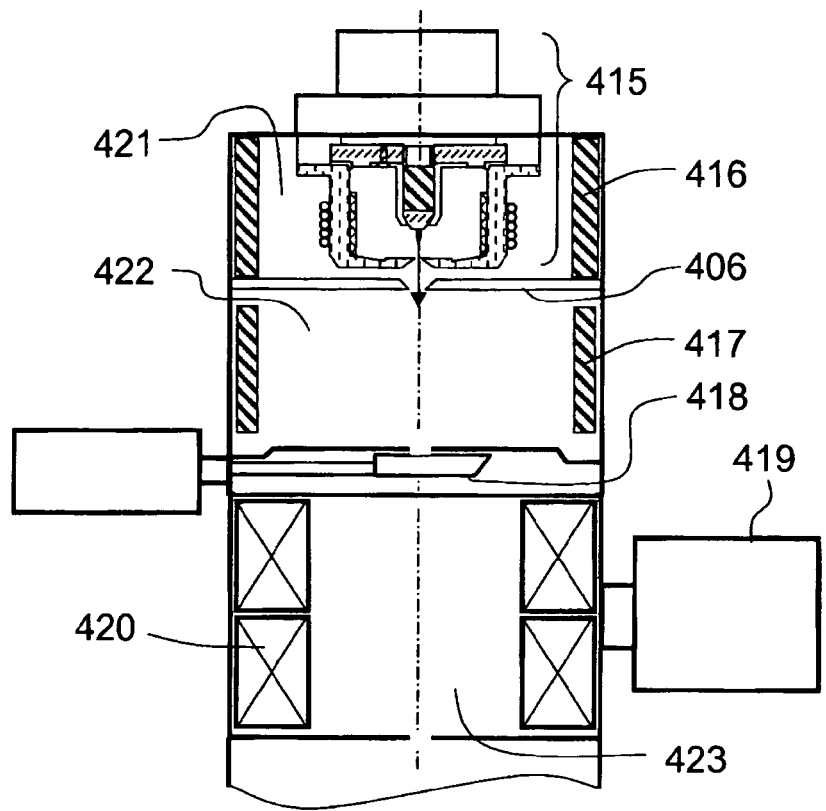
FIG. 17 is a view for explaining an example of applying the present invention to the small-sized magnetic-field-superposed electron gun using a permanent magnet.

Next, an entire configuration of a small magnetic-field-superposed electron gun of the present embodiment will be described with reference to FIG. 17. The above described small magnetic-field-superposed electron gun 415 is present in the first vacuum chamber 421 in the most upstream. A nonevaporative getter pump 416 is provided on the inner wall of this first vacuum chamber and can be activated with a heater not shown in the drawing. The first vacuum chamber is connected with a second vacuum chamber 422 through an anode electrode 406 having an aperture where electron beam passes. A nonevaporative getter pump 417 is provided also on the inner wall of this second vacuum chamber, heated with a heater not shown in the drawing and is activated.

An aperture is present at the downstream side of the second vacuum chamber, which is connected to the third vacuum chamber 423. This aperture can be opened/closed with a gun valve 418, and at the time of maintenance, the gun valve is closed so that the second vacuum chamber can be separated from the third vacuum chamber while keeping the area where the electron gun 415 is present to high vacuum.

Electron optical system composed of coil 420 is present in the third vacuum chamber, which undergoes vacuum pumping with an ion pump 419. An aperture is present also at the downstream side of the third vacuum chamber, which is connected to a vacuum chamber at the further downstream side.

With the configurations described so far, a small magnetic-field-superposed electron gun that is compact, light with no coil being present at the atmosphere side and with less aberration can be derived.

Embodiment 9

In this example, another example of applying the present invention to the prober apparatus as Embodiment 4 will be described with reference to FIG. 18.

In Embodiment 4, the apparatus is characterized in that SEM columns 53 for monitoring are placed obliquely to a sample to obtain a stereographic image. In this example, one of the SEM columns 53 for monitoring is placed just above a sample 52, and the other column is placed such that an optical axis is situated in the surface of the sample. For each column, adjustment of a field of view and focusing can be performed by driving means (not shown).

Figure 18:
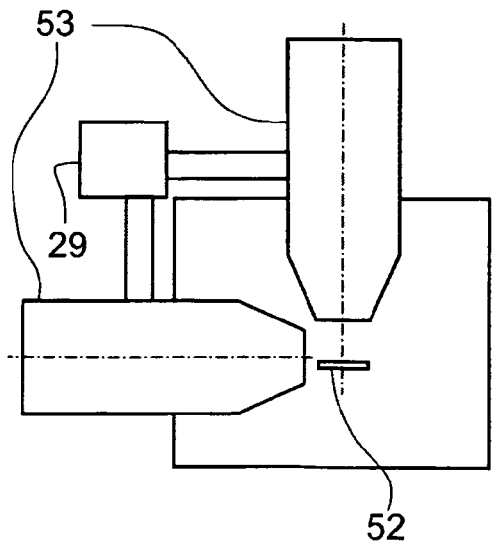
FIG. 18 is a view for explaining another example of applying the present invention to the prober apparatus.

By making an arrangement as described above, the sample 52 can be moved to an observation position of the SEM column 53 after rough alignment of a probe and a circuit terminal by an optical microscope not shown in FIG. 18, and further, by using high-resolution SEM images, alignment in the flat surface of the sample can be performed from a SEM image present just above the sample while a relative distance in height between the probe and the circuit terminal can be observed from the other SEM image, thus making it possible to perform a contact operation more quickly than contact detection by conventional tunnel current detection and without causing damage to the probe and the circuit terminal.

Evacuation pumping of the SEM columns 53 by ion pumps 29 according to the present invention can be performed by the same ion pump 29 for both the SEM columns.

Other apparatus configurations and procedures may be same as those shown in Embodiment 4.

Embodiment 10

In this example, an example of another configuration of the prober apparatus will be described. In the conventional SEM type prober apparatus described in JP-A-09-326425, too much time is taken until contact of the prove with the sample is completed, or the probe tends to be moved inadvertently so closely to the sample that the sample and the probe are damaged, since information in a Z direction of the probe cannot be obtained from the SEM image when bringing the probe into contact with the sample.

In the prober apparatus of this embodiment, a small-sized SEM column is placed just beside or obliquely to a column for a main electron optical apparatus. By this configuration, a SEM type prober apparatus capable of acquiring positional information in a Z direction of the probe is achieved, and thus the aforementioned problem can be solved. For this purpose, a body of a vacuum sample chamber for holding the main electron optical apparatus is provided with a vacuum introducing mechanism for introducing the small-sized SEM column.

Figure 19:
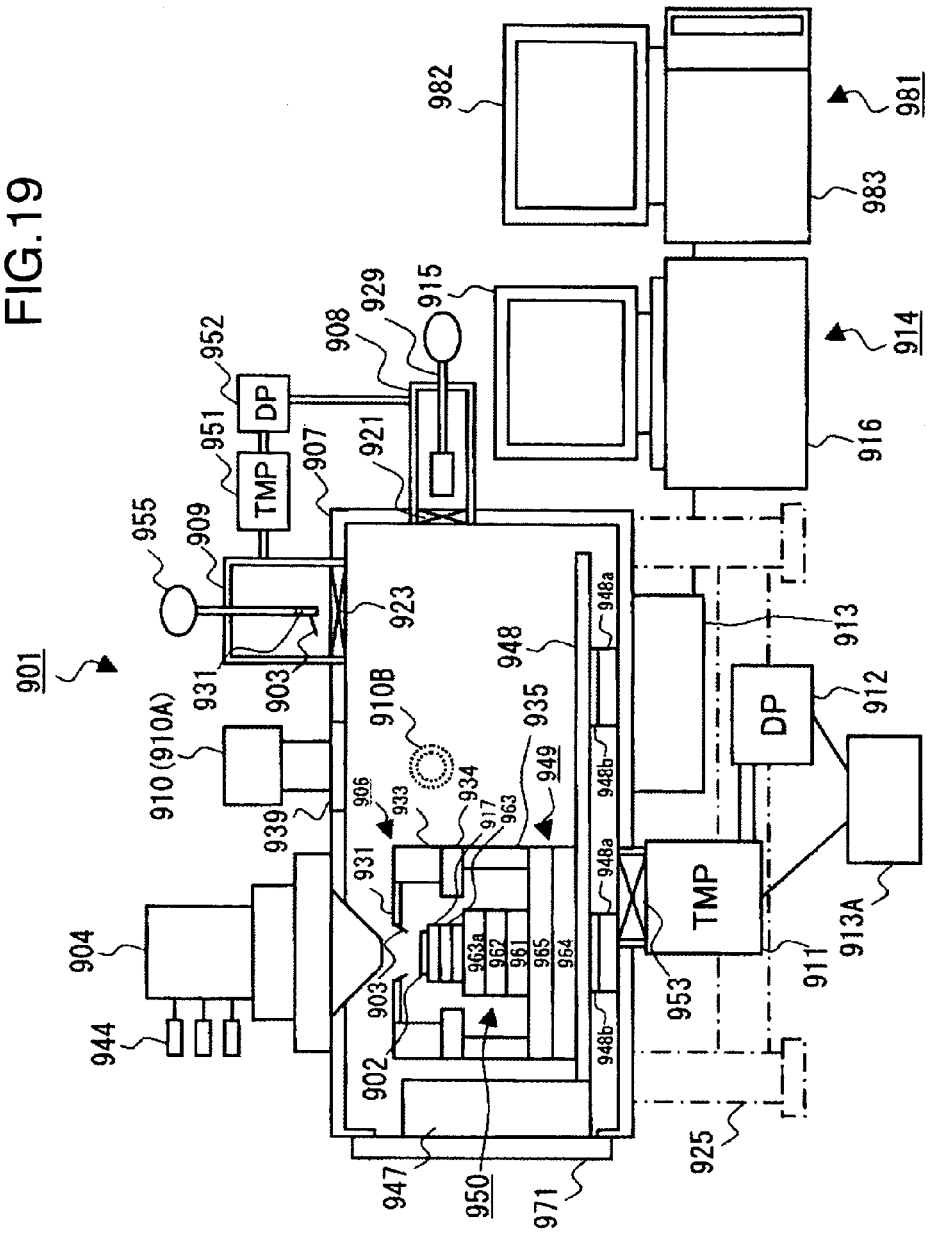
FIG. 19 is a view for explaining another conventional prober apparatus.

First, a basic configuration and a function of a prober 901 will be described. FIG. 19 shows a general configuration of the prober 901 of this example. In FIG. 19, the prober 901 comprises a stage including a sample holder 902 holding a sample in a sample chamber 907 and a sample holder receiver 917 holding the sample holder 902, and a probe stage 906 including a probe unit 933. The sample is fixed on the sample holder 902, but is not shown in FIG. 19 for convenience of drawing because it is a thin piece. A first electron optical apparatus 904 (which may be called a charged particle apparatus) comprising ion pumps 944, such as a scanning electron microscope (SEM) or a focused ion beam (FIB) apparatus, is provided in a housing of the sample chamber 907 so as to face the sample holder 902 for inspection of the sample. Although not shown in FIG. 19, a second electron-optical apparatus is placed on a side opposite on the sheet plane to the first electron optical apparatus 904. An image acquiring apparatus for a probe rough approach 910 is provided in the proximity of the first electron optical apparatus 904. From the first electron-optical apparatus 904, charged particle beams (electron and ion beams) for observation of the surface of the sample and motion of a probe 903 are applied in the direction of the sample holder 902.

The image acquiring apparatus for a probe rough approach 910 provided in the proximity of and in parallel to the first electron optical apparatus 904 on the top face part of the housing of the sample chamber 907 comprises a probe rough approach optical microscope and a CCD camera for acquirement of images, and can observe a state of rough approach of the probe 903 to the sample and acquire the same as image information. For the image acquiring apparatus for a probe rough approach 910, not only a vertically arranged image acquiring apparatus for a probe rough approach 910A but also a laterally arranged image acquiring apparatus for a probe rough approach 910B that is arranged crosswise is used. Owing to the crosswise arrangement, the probe 903 can be observed from above and in a lateral direction, and the rough approach state is reliably gasped. At this time, the scaling factor of the rough approach image in a lateral direction is greater than the scaling factor of the rough approach image from above.

In measurement, rough approach in which probes 903 are brought close to each other in a horizontal direction is firstly performed by the image acquiring apparatus for a probe rough approach 910A, but at this time, it is necessary to capture a plurality of probes 903 in rough approach images. For rough approach in a lateral direction, the probes 903 are lowered to be close to the sample while viewing rough approach images in a lateral direction. Thereafter, the probes 903 are brought into contact with the sample while checking the focus matching between the front end of the probe 903 and the sample using the first electron optical apparatus 904. If a distance between the probe 903 and the sample is small in rough approach in a lateral direction, time taken for the operation of bringing the probe 903 close to the sample using the first electron optical apparatus 904 can be shortened. Therefore, the scaling factor of the rough approach image in a lateral direction is greater than the scaling factor of the rough approach image from above.

The stage comprises the sample holder 902 holding a sample, and a sample stage 950 mounting the sample holder 902, and a large stage 949 mounting the sample stage 950, and a base 948 on which the large stage 949 moves. The stage is attached to the side face of the sample chamber 907 via a face plate 971. The face plate 971 is attached to the sample chamber 907 via a guide coupling plate 971a and a guide 971b using a roller.

Figure 20A:
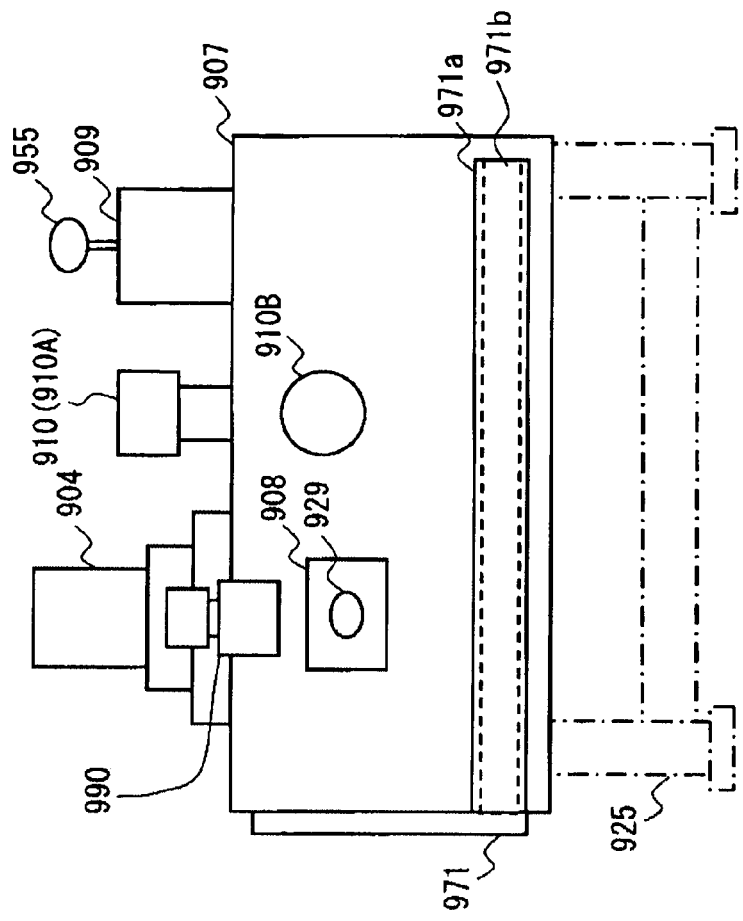
FIGS. 20A and 20B are views for explaining an example of applying the present invention to another prober apparatus.
Figure 20B:
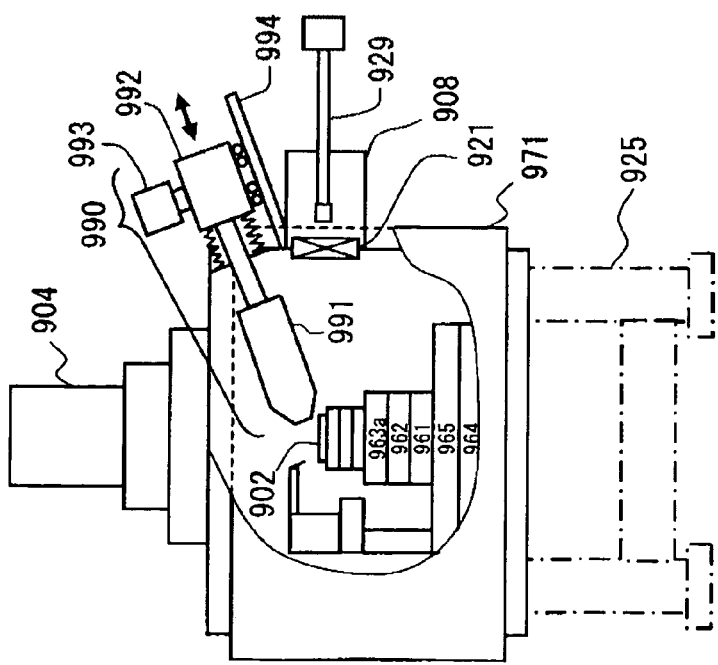

A front view and a side view of the prober apparatus of this example are shown in FIGS. 20A and 20B, respectively. As shown in FIG. 20B, the stage is pulled out along the guide 971b when performing maintenance of the stage and exchange of the probe unit. A guide block 948a attached to the lower part of the sample chamber 907 in FIG. 19 is used for positioning of the stage in a vertical direction with respect to the first electron optical apparatus 904, and also provides guidance when pulling out the stage from the sample chamber 907. To the upper part of the guide block 948a is bonded a sliding member 948*b* of a polymeric material or the like which easily slides between itself and the bottom part of the base 948.

The probe stage 906 comprises the probe unit 933 having a probe holder holding the probe 903, a probe unit base 934 holding the probe unit 933, and a probe unit pad 935 connecting the probe unit base 934 to the large stage 949. The probe unit 933 comprises x, y and z tables (not shown), and can move the probe 903 three-dimensionally.

The base 948 is fixed on the face plate 971 by a fixing member 947. The sample chamber 907 is provided with a sample exchange chamber 908 and a probe exchange chamber 909.

The face plate 971 is provided with a field-through for sending signals for controlling operations of x, y and z tables of the probe unit 933 and signals for controlling operations of x, y and z tables 961, 962, 963 and 963*a* of the sample stage 950 from outside the sample chamber 907.

The inside of the sample exchange chamber 908 and the inside of the sample chamber 907 are connected via a gate-valve 921. The inside of the sample exchange chamber 908 is connected to a dry pump (DP) 952, whereby vacuum processing is performed. Consequently, the sample holder 902 holding the sample can be changed by conveyance means 929 while maintaining the sample chamber 907 under vacuum. In FIG. 19, it appears that the sample exchange chamber 908 is connected to the right side face of the sample chamber 907 for convenience of drawing, but actually, as shown in FIGS. 20A and 20B, the sample exchange chamber 908 is provided on the side face of the sample chamber 907 on the front in FIG. 19 so that it is easily placed on the stage below the first electron optical apparatus 904.

On the upper face part of the housing of the sample chamber 907, the first electron optical apparatus 904 and the image acquiring apparatus for a probe rough approach 910A are provided in parallel, and the probe exchange chamber 909 is provided in proximity of the image acquiring apparatus for a probe rough approach 910A. The inside of the probe exchange chamber 909 is connected to the inside of the sample chamber 907 via the gate-valve 923. The probe exchange chamber 909 is connected to a turbo molecular pump (TMP) 951 and a DP 952 coupled to the TMP 951, whereby vacuum processing is performed. The probe unit 931 is changed by changing means 955 while maintaining the sample chamber 907 under high vacuum.

A TMP 911 is connected to the sample chamber 907 via a gate-valve 953, and the TMP 911 is further connected to a DP 912. The housing of the sample chamber 907 is supported on a stand 925 shown with the chain line.

A control apparatus 913 consisting of a probe unit controlling portion and a stage controlling portion and another control apparatus 913A controlling high vacuum processing by the TMP 911 and the DP 912 are provided. The control apparatus 913A also controls the TMP 951 and the DP 952.

Further, the prober 901 comprises a display apparatus 914 having an image display portion 915 and an image display controlling portion 916, the probe 903 and stage operation signals from the image display controlling portion 916 are transmitted to the probe unit controlling portion and the stage controlling portion, and the probe unit 933 and the stage and large stage 949 are controlled.

Further, the prober 901 comprises a workstation (WS) for computer aided design (CAD) 981 having an image display portion 982 and an image display controlling portion 983. The WS for CAD 981 is connected to the display apparatus 914 to transmit CAD image data to the display apparatus 914 as required.

When changing the probe, the probe is exchanged after the y table and the x table of the probe unit 933 are moved to a predetermined position (e.g. rear end) and the z table is moved to a predetermined position (e.g. upper end).

By moving the sample stage 950, part of the sample to be measured, i.e. a part to be brought into contact with the probe 903, is displayed on the image display portion 915 displaying image information from the first electron optical apparatus 904, and the probe 903 is brought into contact with the part of the sample to be brought into contact with the probe 903 by operating the x, y and z tables of the probe unit 933 while viewing the probe 903 and the sample.

In the present invention, drive apparatuses for the probe 903 and the stage are not specifically limited, but for example, an apparatus using a piezo element, a DC motor, an ultrasonic motor or the like may be used as for a drive mechanism for the probe. For a drive mechanism for the stage, a pulse motor, a DC motor, an ultrasonic motor or the like may be used.

Configurations and operations of main components of the apparatus will be described below.

1. Configurations and Operations of Main Components of Apparatus (1) Stage:

The stage comprises the large stage 949 and the sample stage 950.

(a) Sample Stage 950:

The sample stage 950 comprises the y table 962, the x table 961 and the z tables 963 and 963*a*, and the tables are moved in y, x and z directions, respectively, by a drive mechanism. The sample stage 950 comprises means for drive in a z (vertical) direction, whereby mechanical interference between a sample 902*a* and the front end of an electron gun 904 can be avoided by lowering the sample stage 950 in a z direction before moving the large stage 949 and the sample stage 950 in x and y directions. Further, in fact, when SEM observation is carried out using this example, a working distance between the front end of the electron gun 904 and the sample 902*a* can be decreased by lifting the sample stage 950 in the z direction, and the spatial resolution of the SEM can be thereby improved. In this example, the means for drive in a z direction is incorporated in the sample stage 950, but it may be incorporated in the large stage 949 or incorporated in both the stages, and this allows a similar effect to be obtained.

Movement of the y and x tables 962 and 961 is carried out by driving a ball screw by a DC motor placed in the sample chamber 907, and guidance is performed by a cross-roller guide (not shown). Movement of the z table 963 is carried out by driving a DC motor mounted on the z table 963. As shown in FIG. 19, the sample holder 902 and the sample are fixed on the sample holder receiver 917 mounted on the z table 963. Thus, the sample is moved in x, y and z directions with respect to the electron beam. The z table 963 has a measurement position, a sample exchange position and a probe exchange position. The measurement position is a position at which the probe 903 is brought into contact with the sample, the sample exchange position is a position below the measurement position, and the probe exchange position is a position further below the measurement position. By setting the positions, collision between the sample and the probe 903 can be prevented when changing the probe 903 and the sample.

(b) Large Stage 949:

As shown in FIG. 19, the large stage 949 consists of the y table 965 and the x table 964, and is moved in y and x directions by a drive apparatus (not shown). The sample stage 950 is placed on the large stage 949 and driven.

As shown in FIG. 19, the probe unit 933 constituting the probe stage 906, the probe unit base 934 holding the probe unit 933, and the probe unit pad 935 are placed on the large stage 949. The probe unit 933 is moved in y, x and z directions. Consequently, the probe holder 931 held on the probe unit 933 is moved, and the probe 903 held at its front end is moved in y, x and z directions.

The large stage 949 is moved on the base 948, and the sample stage 950 is moved on the large stage 949. Since the electron optical apparatus 904, the image acquiring apparatus for a probe rough approach 910A and the probe exchange chamber 909 are provided in parallel on the top face side of the housing of the sample chamber 907, a moving mechanism can move the sample and the probe 903 to a probe rough approach image acquirement position, a SEM observation position and the probe exchange position. Namely, the moving mechanism can move the stages (sample stage 950 and probe stage 906) between a position of the image acquiring apparatus for a probe rough approach 910 in a vertical direction and a position of the first electron optical apparatus 904 in a vertical direction and a position of the probe exchange chamber 909 in a vertical direction.

Thus, the sample and the probe 903 are moved between the position of the image acquiring apparatus for a probe rough approach 910 in a vertical direction and the position of the first electron optical apparatus 904 in a vertical direction and the position of the probe exchange chamber 909 in a vertical direction.

In this example, the large stage 949 can be moved on the base 948 while maintaining high vacuum. By employment of such a movement method, rough approach of the probe 903 to the sample and accurate positioning can be performed quickly and easily. Further, the probe 903 can be exchanged while maintaining high vacuum, and exchange of the probe 903 can be performed quickly and easily.

Thus, the moving mechanism can move the sample and the probe 903 from a position just below the image acquiring apparatus for a probe rough approach 910 provided in parallel to the first electron optical apparatus 904 to a position just below the first electron optical apparatus 904 while maintaining high vacuum.

(2) Scanning Electron Microscope (SEM):

The scanning electron microscope is one example of the first electron optical apparatus 904, and is used for observation means for bringing the probe 903 into contact with a desired location on the sample, and placed on the upper part of the sample chamber 907. Vacuum pumping is performed by the ion pump 944. Reference numeral 990 shown in FIG. 20A denotes a second electron optical apparatus, which consists of a small-sized SEM column 991, small-sized SEM column driving means 992, a connection member establishing connection therebetween, and the like. The small-sized SEM column driving means 992 and the connection member comprises therein a pumping pipe for vacuum pumping, and further, the small-sized SEM column driving means 992 is provided with an ion pump 993 for rough pumping in the small-sized SEM column 991. Forming the aforementioned connection member with the pumping pipe itself is preferable because the conductance during rough pumping increases. The inner structure of the small-sized SEM 991 will be described only briefly because it is similar to those described in Embodiments 1 to 9, and the small-sized SEM 991 comprises an electron gun chamber including an electron gun and a housing surrounding the electron gun, an illumination electron optical system comprising a scanning coil for scanning on the sample an electron beam emitted from the electron gun, an objective lens for focusing onto the sample the electron beam passing through the scanning coil and the like, a secondary electron detector detecting generated secondary electrons, and the like. The small-sized SEM column 991 of this embodiment comprises a differential pumping system using a nonevaporative getter pump and the ion pump 993 placed in the small-sized SEM column 992, and maintains the electron gun chamber most upstream of a pumping system under extreme high vacuum by the combined use of the non-evaporative getter pump provided in each upstream vacuum chamber. In this embodiment, the ion pump 993 is provided in the small-sized SEM column driving means 922, but the ion pump can be attached to the small-sized SEM column 911, and in any of the configurations, the differential pumping system can be achieved. However, attaching the ion pump such that it is situated outside the sample chamber 907 (i.e., attaching the ion pump to the small-sized SEM column driving means 922) leads to a smaller size of the housing of the sample chamber 907.

The second electron optical apparatus 990 is placed just above the sample exchange chamber 908 on the side face of the sample chamber 907. Accordingly, a vacuum introducing mechanism consisting of bellows or the like is provided at the corner of the sample chamber 907. By the vacuum introducing mechanism, the second electron optical apparatus 990 is positioned in an oblique direction with respect to the sample 202. The second electron optical apparatus 990 is placed in a drive guide 994 comprising drive means such as a motor, and is brought closer to the sample 902 up to a predetermined observation position at the time of acquirement of an image in an oblique direction, and moved to a withdrawal position in other cases. Even when the second electron optical apparatus 990 is moved to the withdrawal position, the small-sized SEM column 991 is always under vacuum in the sample chamber 907. By employing the structure described above, a sample exchange step and observation of SEM images for approach of the probe to the circuit terminal can be performed quickly and safely (free from crash of the probe and the circuit terminal).

In FIG. 20A, the second electron optical apparatus is placed in a direction oblique to the sample, i.e., obliquely to the first electron optical apparatus 904, but the second electron optical apparatus may be placed in a direction horizontal to the sample. In this case, however, it is necessary to provide the second electron optical apparatus in the proximity of a position at which mechanical interference with the sample exchange chamber 908 does not occur. When the second electron optical apparatus is placed obliquely to the sample, a working distance between the small-sized SEM column 991 and the sample can be shortened, and therefore a high-resolution SEM image is acquired with advantage. When the second electron optical apparatus is placed horizontally to the sample, the probe can be observed from just beside, and therefore positional information of the front end part of the probe is acquired with advantage.

(3) Sample Chamber 907:

The sample chamber 907 consists of a top cover and a sample chamber case as a housing, and on a side face of the sample chamber case, the base 948 is mounted on the face plate 971 via the fixing member 947, the probe unit 933 is placed on the large stage 949 in the sample chamber 907, and the sample exchange chamber 908 is mounted on another side face. On the top cover are mounted the first electron optical apparatus 904, the image acquiring apparatus for a probe rough approach 910 and the probe exchange chamber 909. The sample chamber 907 is fixed on a load plate mounted on an antivibration mount mounted on the stand 925. The sample chamber 907 is evacuated by the TMP 911 and the DP 912.

(4) Optical Microscope for Probe Rough Approach, CCD Camera, Image Acquiring Apparatus for Probe Rough Approach:

A sample of which the electric property is measured is, for example, a semiconductor, and the probe 903 is brought into contact with a plug that is normally connected to a source, a drain, a gate and a well. A plug of small type has a diameter of several tens nm, and for bringing the probe into contact with this plug, a SEM having a high resolution is required. However, when irradiated with an electron beam, a semiconductor sample may be damaged by the electron beam, and it is thus desired to shorten the beam irradiation time wherever possible. Therefore, beforehand, a plurality of probes are brought closer in a horizontal direction based on the detection value of the image acquiring apparatus for a probe rough approach 910, and brought closer to the surface of the sample in a vertical direction. Images obtained from the probe rough approach optical microscope and the CCD camera mounted thereon are displayed on a monitor of the image display portion 915, and the aforementioned task is carried out while viewing the images.

The scaling factor on the monitor is several tens times for bringing the probes 903 mutually as close as possible and capturing the probes 903 and the sample in one image. A light source is placed in the proximity of the probe rough approach optical microscope. Observations by the probe rough approach optical microscope and the CCD camera and introduction of light from the light source into the sample chamber are carried out through a viewing port 939 shown in FIG. 19.

(5) Sample Exchange Chamber 908:

The sample exchange chamber 908 is provided for exchanging the sample without breaking vacuum in the sample chamber 907, and evacuated by the DP 952. The sample exchange chamber 908 is isolated from the sample chamber 907 by the gate-valve 921. For introducing the sample, a male screw at the front end of an exchange rod as conveyance means 929 for the sample and the sample holder 902 is screwed into a female screw provided in the sample holder 902 to which the sample is bonded, and the gate-valve 921 is opened to insert the sample into the holder receiver 917 attached to the upper end of the z table 963 of the sample stage 950. For taking out the sample, the task is carried out in a reverse order. This allows the sample exchange time to be shortened.

(6) Probe Exchange Chamber 909:

The probe exchange chamber 909 is provided for exchanging the probe 903 without breaking vacuum in the sample chamber 907, and intended for shortening the probe exchange time. The probe exchange chamber 909 is isolated from the sample chamber 907 by the gate-valve 923. The probe exchange chamber 909 is evacuated by the TMP 951 and the DP 952. The reason why the TMP 951 is used is that the probe exchange chamber 909 is so large that if it is evacuated by the DP 952 alone, the gate-valve 923 will be opened under a high pressure in the probe exchange chamber 909, resulting in much time being taken for the pressure in the sample chamber 907 after exchange to recover to an original value.

2. Control System:

Control of the first electron optical apparatus 904, the second electron optical apparatus 990, the probe unit 933 and each part of the stage is performed using control circuits included in the control apparatus 913 and a computer. The SEM, the probe unit 933 and the stage can be operated by either operation panels or a GUI on the monitor.

The control apparatus 913 comprises a stage controlling portion for controlling the position of each stage, and a probe controlling portion for driving the probe unit 933 independently of the stage. The image controlling portion 916 includes a secondary electron detector controlling portion, and a controlling portion for an electron beam illumination optical system, and the like. In addition, a calculation processing portion has a function of displaying as images the probe holder 931, the sample, and the state of probe approaching terminal of the probe 903 to the sample in cooperation with a control portion of the display apparatus 914.

Further, by operating an operating screen of the image display portion, operation signals are provided to the probe unit controlling portion and the stage controlling portion through the image display controlling portion to move and position the probe unit 933 and the stage. Alternatively, an operation panel having a joystick may be used to move and position the probe unit 933 and the stage.

(1) SEM:

An electron beam generated in the electron gun is applied to a sample through a focusing lens and an objective lens, secondary electrons generated from the sample are detected by a secondary electron detector, their signals are subjected to a variety of electric processing in a display, and an image of the surface of the sample is projected on the monitor on the image display portion 915 of the display apparatus 914.

(2) Probe Unit 933:

For signals for controlling the operations of the x, y and z tables of the probe unit 933, as shown in FIG. 19, signals of the control circuit 913 in the stand 925 are provided to the probe unit 933 in the sample chamber 907 via a field-through mounted on the face plate 971 of the stage.

Input signals that are provided to the sample through the probe 903 attached to the probe holder 931, and output signals that are obtained from the sample are input to and output from, for example, a semiconductor parameter analyzer via a three-layer coaxial hermetic connector attached to the sample chamber 907.

(3) Stage:

For signals for controlling the operations of the x, y and z tables 961, 962, 963 and 963a of the sample stage 950 on the stage, signals of the control circuit in the stand 925 are provided to the sample stage 950 in the sample chamber 907 via the field-through mounted on the face plate 971.

3. Display Apparatus 914:

The display apparatus 914 displays a rough approach image acquired by the image acquiring apparatus for a probe rough approach 910, and an image of probe approaching terminal of the probe 903 to the sample, acquired by the first electron optical apparatus 904 or the second electron optical apparatus 990. That is, a probe operation screen and an operation procedure screen showing the specifics of operation procedure are displayed.

A user positions the sample and the probe 903 with high accuracy while viewing the rough approach image and the image of probe approaching terminal in accordance with the operation procedure displayed on the operation procedure screen.

4. Workstation for CAD 981:

The prober 901 comprises the WS for CAD 981 having the image display portion 982 and the image display controlling portion 983. The WS for CAD 981 is connected to the display apparatus 914, and transmits CAD image data to the display apparatus 914 as required.

According to the configuration described above, a part of the sample to be measured, i.e., a part to be brought into contact with the probe 903 can be displayed on the image display portion 915 displaying image information from the first electron optical apparatus 904, by moving the sample stage 950, while referring to CAD information, and the probe unit 933, i.e., the probe 903 can be moved in x, y and z directions to be brought into contact with the part of the sample that is to be brought into contact with the probe 903 while viewing an SEM image and a CAD image of the probe 903 and the sample.

Further, in this embodiment, the display apparatus 914, the workstation for CAD 981 and other control portions are constructed as separate computers, but they may be integrated and constructed as one computer.

Thus, introduction of CAD navigation remarkably improves user convenience when probing a probe to a position of probe approaching terminal.

In this embodiment, a semiconductor is provided as an example of the sample, but the apparatus of the present invention may be used for measurement of a sample other than a semiconductor if a local electric property is to be measured. For example, the apparatus may be used for measurement of a local insulation resistance of a magnetic head. In addition, general fine electronic circuits such as wiring parts of circuits, electrodes and memory cells may be inspection objects. As a sample including an inspection object, a semiconductor wafer, a chip or sample substrate having a circuit patter formed thereon, or a sample piece prepared by cutting the sample substrate and taking out some of the cut pieces may be used.

Figure 21:
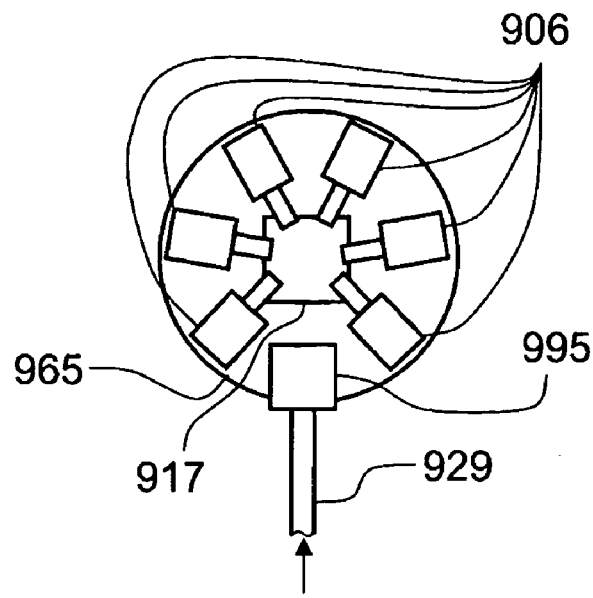
FIG. 21 is a view for explaining the positions of a probe of another prober apparatus and sample exchanging means.
Figure 22:
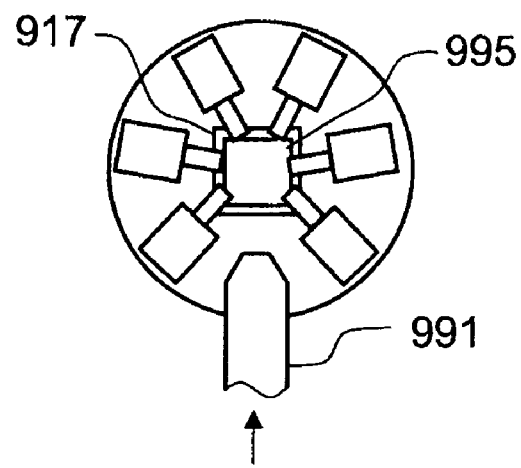
FIG. 22 is a view for explaining the positions of the probe of another prober apparatus and a small-sized SEM.

FIGS. 21 and 22 show positional relations between the probe stages 906 and the sample conveyance means 929, and the small-sized SEM column 991 when viewing the stage from above. Six probe stages 906 are placed on the stage 965 so as to surround the sample 995. A space is partly provided in a deltaic form so that the sample fixed on the front end of the sample conveyance means 929 and the small-sized SEM column 991 can enter alternately. As described previously, the small-sized SEM column may be introduced obliquely or in a direction vertical to the first electron optical apparatus 904. That is, it is important to place both of a sample introducing mechanism and a small-sized SEM introducing mechanism in the same direction when viewed from above the sample stage. Consequently, there is an advantage that both the small-sized SEM column 991 and sample conveyance means 929 can be introduced onto the stage without reducing the number of probe stages that are placed on the stage.

Next, steps of exchanging a sample and bringing the probe into contact with the circuit terminal will now be described. The sample is attached to the front end of sample exchange means 929 in the sample exchange chamber 908. The sample exchange chamber 908 is evacuated, the gate-valve 921 is then opened, and, the sample conveyance means 929 moves into the sample chamber 971 to insert the sample 995 into the sample receiver 917 placed on the stage 965 and fix the sample. After separating the sample 995, the sample conveyance means 929 is pulled back and stored in the sample exchange chamber 908.

Thereafter, the stage is driven to be moved to a position where the rough approach image acquiring apparatus 910 is situated, and rough alignment between the probe and the circuit terminal on the sample is performed using the rough approach image acquiring apparatus 910 in a manner described above. Then, the stage is driven to be moved to a position allowing observation of high factor from above with a SEM image by the SEM 904. After accurately aligning the probe 903 and the circuit terminal on the sample 995 viewed from above with the SEM image, the probe 903 should be lowered to be in contact with the circuit terminal.

At this time, the small-sized SEM column 991 of the present invention is interchangeably introduced into a region used when the sample conveyance means 929 introduced the sample 995, so that SEM image observation can be performed. The observable SEM image is an image of the probe and the circuit terminal viewed obliquely from above, and is similar to the image of FIG. 9 obtained from the apparatus described in Embodiment 4. Since information allowing a distance between the probe 903 and the circuit terminal to be visually captured is obtained from the SEM image, operations of approach and contact between the probe and the circuit terminal can be performed quickly and safely without crash being caused by the operations of approach and contact. Further, an efficient arrangement using six probes 906 can be achieved without mechanically interfering with the probes 906 densely placed on the stage, and at the same time, six circuit terminals can be used, thus making it possible to broadly set options for measurement modes.

The apparatus configuration described above can be achieved without necessarily using a differential pumping system. However, by applying the differential pumping system, the number of ion pumps required to be provided in the second electron optical apparatus 990 can be reduced, which is very advantageous in improvement of a vibration-proof performance of the apparatus. As shown in FIG. 19, the first electron optical apparatus 904 also comprises a plurality of ion pumps 944, and by applying the differential pumping system to the first electron optical system 904, the number of ion pumps required can be reduced to one.

Thus, by applying the differential pumping system to the vacuum pumping system of each electro optical apparatus, the vibration-proof performance/vibration resistance performance is markedly improved.

Embodiment 11

In this embodiment, the following prober apparatus is disclosed.

It is a prober apparatus comprising two sets of scanning electron microscope columns having a differential pumping system with two or more vacuum chambers coupled together via an aperture, comprising a nonevaporative getter pump on the upstream side and comprising an ion pump in any of vacuum chambers on the downstream side; or the aforementioned prober apparatus, wherein one ion pump placed in the two sets of scanning electron microscope columns is used for both the two scanning electron microscope columns; or the aforementioned prober apparatus, wherein same regions have mutually different view angles in fields of view of the two sets of scanning electron microscope columns.

Alternatively, it is a prober apparatus comprising a circuit terminal provided on the surface of a sample, a plurality of probes contacting the circuit terminal, means for positioning the probes, and means for introducing the sample into the prober apparatus, wherein the prober apparatus aperture comprises a scanning electron microscope column having a differential pumping system with two or more vacuum chambers coupled together via an aperture, comprising a nonevaporative getter pump on the upstream side and comprising an ion pump in any of vacuum chambers on the downstream side.

Alternatively, it is the aforementioned prober apparatus, wherein the scanning electron microscope column comprises moving means capable of positioning in a uniaxial direction.

Alternatively, it is the aforementioned prober apparatus, wherein a plurality of the probes are placed on a periphery of a sample, and a part of the periphery is freed as a space in which none of the probes is provided and which the sample introducing means and the scanning electron microscope column have in common.

Embodiment 12

In this embodiment, the following focused ion beam apparatus and sample preparing apparatus are disclosed. This system has a focused ion beam apparatus having a differential pumping system with two or more vacuum chambers coupled together via an aperture, comprising a nonevaporative getter pump on the upstream side, an ion pump in any of vacuum chambers on the downstream side, and an ion source in the most upstream vacuum chamber.

Alternatively, this system has a sample preparing apparatus comprising a focused ion beam column, a scanning electron microscope column, and a sampling arm cutting out very small sample pieces from a sample, wherein the focused ion beam column has a differential pumping system with two or more vacuum chambers coupled together via an aperture, comprising a nonevaporative getter pump on the upstream side, an ion pump in any of vacuum chambers on the downstream side and an ion source in the most upstream vacuum chamber.

Alternatively, this system has a sample preparing apparatus comprising a focused ion beam column, a scanning electron microscope column, and a sampling arm cutting out very small sample pieces from a sample, wherein the scanning electron microscope column has a differential pumping system with two or more vacuum chambers coupled together via an aperture, comprising a nonevaporative getter pump on the upstream side, an ion pump in any of vacuum chambers on the downstream side and an electron source in the most upstream vacuum chamber.

Alternatively, this system has the aforementioned sample preparing apparatus, wherein the scanning electron-microscope column has a differential pumping system with two or more vacuum chambers coupled together via an aperture, comprising a nonevaporative getter pump on the upstream side, comprising an ion pump in any of vacuum chambers on the downstream side and an electron source in the most upstream vacuum chamber.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A magnetic-field-superposed electron gun comprising:
   a differential pumping system comprising two or more vacuum chambers coupled together via an aperture;
   a nonevaporative getter pump on an upstream side;
   an ion pump in any of the vacuum chambers on a downstream;
   an electron source on a most upstream vacuum chamber;
   a permanent magnet in the proximity of the electron source,
   wherein the permanent magnet is positioned as a center axis; and
   at least two different magnetic poles at axisymmetric positions with respect to the electron source as the center axis.

2. The magnetic-field-superposed electron gun according to claim 1, further comprising;
   a magnetic coil placed in the proximity of the electron source and being detachably attachable from an atmosphere side, instead of said permanent magnet.

3. A charged particle beam apparatus comprising:
   a first vacuum chamber, having an electron source or ion source, on an upstream side;
   a second vacuum chamber, coupled with the first vacuum chamber via an aperture, on a downstream side,
   wherein the first vacuum chamber comprises a first nonevaporative getter pump and is absent from any ion pumps, and
   wherein the second vacuum chamber comprises a second nonevaporative getter pump and ion pump; and
   a column comprising the first and second vacuum chambers,
   wherein the first nonevaporative getter pump is provided on the bore of the column and a heater to heat the first nonevaporative getter pump is provided outside the column.

4. A charged particle beam apparatus comprising:
   first vacuum chamber, having an electron source or ion source, on an upstream side;
   a second vacuum chamber, coupled with the first vacuum chamber via an aperture, on a downstream side,
   wherein the first vacuum chamber comprises a first nonevaporative getter pump and is absent from any ion pump, and
   wherein the second vacuum chamber comprises a second nonevaporative getter pump and ion pump;
   a column comprising the first vacuum chamber and the second vacuum chamber; and
   an electrode, provided with a first heater, arranged between the first vacuum chamber and the second vacuum chamber,
   wherein the first nonevaporative getter pump is provided on the bore of the column and a second heater to heat the first nonevaporative getter pump is provided on the electrode.

5. The charged particle beam apparatus according to claim 4, further comprising:
   a third nonevaporative getter pump provided on the bore of the column in the second vacuum chamber.

* * * * *